US012804828B2

(12) United States Patent
Choi et al.

(10) Patent No.: US 12,804,828 B2
(45) Date of Patent: Nov. 17, 2026

(54) ELECTRONIC DEVICE COMPRISING DRIVING MOTOR

(71) Applicant: Samsung Electronics Co., Ltd., Suwon-si (KR)

(72) Inventors: Nakhyun Choi, Suwon-si (KR); Hyunsuk Kim, Suwon-si (KR); Sanghyuk Park, Suwon-si (KR); Soohyun Seo, Suwon-si (KR); Wonho Lee, Suwon-si (KR); Joongyeon Cho, Suwon-si (KR); Junghyeob Lee, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 18/818,000

(22) Filed: Aug. 28, 2024

(65) Prior Publication Data

US 2024/0422925 A1 Dec. 19, 2024

Related U.S. Application Data

(63) Continuation of application No. PCT/KR2023/002383, filed on Feb. 20, 2023.

(30) Foreign Application Priority Data

Mar. 11, 2022 (KR) ........................ 10-2022-0030583
Jul. 6, 2022 (KR) ........................ 10-2022-0083298

(51) Int. Cl.
*H05K 5/02* (2006.01)
*H02K 7/116* (2006.01)
(Continued)

(52) U.S. Cl.
CPC ........... *H05K 5/0217* (2013.01); *H02K 7/116* (2013.01); *H05K 5/0086* (2013.01); *H05K 7/1427* (2013.01)

(58) Field of Classification Search
CPC .. H05K 5/0217; H05K 5/0086; H05K 7/1427; H02K 7/116; H04M 1/0235;
(Continued)

(56) References Cited

U.S. PATENT DOCUMENTS 8,711,566 B2 * 4/2014 O'Brien ................ G06F 1/1652 361/724
10,747,269 B1 * 8/2020 Choi ..................... G06F 1/1652
(Continued)

FOREIGN PATENT DOCUMENTS

KR 10-0852588 B1 8/2008
KR 10-2018-0001015 A 1/2018
(Continued)

OTHER PUBLICATIONS

Extended European Search Report dated Apr. 25, 2025, for European Appln. No. 23767040.1-1218.
(Continued)

*Primary Examiner* — Allen L Parker
*Assistant Examiner* — Martin Antonio Asmat Uceda
(74) *Attorney, Agent, or Firm* — Jefferson IP Law, LLP

(57) ABSTRACT

An electronic device is provided. The electronic device includes a first housing, a second housing slidably connected to the first housing, a rollable display disposed to be supported by the first housing and the second housing and having a display area contracted or expanded based on a slide-in state or a slide-out state of the second housing, a support member disposed on the rear surface of the rollable display to support at least a portion of the rollable display, a first printed circuit board disposed in the first housing, a
(Continued)

second printed circuit board disposed in the second housing, a flexible printed circuit board configured to connect the first printed circuit board and the second printed circuit board and configured to be folded or unfolded based on the slide-in state or slide-out state of the second housing, a drive motor disposed in the first housing, electrically connected to the first printed circuit board and configured to provide a driving force to drive the second housing, a battery disposed in the first housing and configured to supply power to the drive motor, a pinion gear disposed in the first housing and configured to transmit power based on the driving force of the drive motor, and a rack gear disposed in the second housing to be engaged with the pinion gear.

18 Claims, 18 Drawing Sheets

(51) Int. Cl.
*H05K 5/00* (2025.01)
*H05K 7/14* (2006.01)

(58) Field of Classification Search
CPC .. H04M 1/0237; H04M 1/0247; H04M 1/026; H04M 1/0268; G06F 1/1624; G06F 1/1637; G06F 1/1652; G06F 1/1656; H01Q 21/28
See application file for complete search history.

(56) References Cited

U.S. PATENT DOCUMENTS

| | | | | |
|---|---|---|---|---|
| 10,944,853 | B2 * | 3/2021 | Lee | H04M 1/0235 |
| 11,042,195 | B1 * | 6/2021 | Hong | G06F 1/1681 |
| 11,058,018 | B1 * | 7/2021 | Yoon | G06F 1/1652 |
| 11,315,443 | B2 * | 4/2022 | Han | G06F 1/1624 |
| 11,538,371 | B2 * | 12/2022 | Wang | G09F 9/301 |
| 11,775,016 | B2 * | 10/2023 | Choi | H04M 1/0237 361/679.01 |
| 12,015,208 | B2 * | 6/2024 | Kim | H04B 1/401 |
| 12,470,650 | B2 * | 11/2025 | Chen | G06F 1/1624 |
| 12,578,765 | B2 * | 3/2026 | Yan | G06F 1/1652 |
| 2005/0253775 | A1 * | 11/2005 | Stewart | G06F 1/1616 345/1.1 |
| 2007/0146243 | A1 * | 6/2007 | Ou Yang | G06F 1/1601 345/76 |
| 2008/0144265 | A1 * | 6/2008 | Aoki | G06F 1/1601 361/679.04 |
| 2009/0051830 | A1 * | 2/2009 | Matsushita | G02F 1/133305 361/679.05 |
| 2010/0259463 | A1 * | 10/2010 | Sip | H04M 1/0247 345/1.3 |
| 2012/0039028 | A1 * | 2/2012 | Choo | H04M 1/0237 361/679.01 |
| 2015/0153777 | A1 | 6/2015 | Liu et al. | |
| 2019/0163241 | A1 | 5/2019 | Moon et al. | |
| 2019/0268455 | A1 | 8/2019 | Baek et al. | |
| 2020/0267247 | A1 | 8/2020 | Song et al. | |
| 2020/0363841 | A1 | 11/2020 | Kim et al. | |
| 2021/0051272 | A1 * | 2/2021 | Liu | H04N 23/57 |
| 2021/0103314 | A1 | 4/2021 | Ko et al. | |
| 2021/0223820 | A1 * | 7/2021 | Yoo | H04M 1/0235 |
| 2021/0250432 | A1 * | 8/2021 | Lim | G06F 1/1686 |
| 2021/0320992 | A1 * | 10/2021 | Song | G06F 1/1624 |
| 2021/0336356 | A1 * | 10/2021 | Choi | G06F 1/1652 |
| 2021/0359392 | A1 * | 11/2021 | Won | H04M 1/0237 |
| 2021/0359411 | A1 * | 11/2021 | Hwang | H01Q 21/28 |
| 2021/0405703 | A1 * | 12/2021 | Song | G06F 1/1694 |
| 2022/0019261 | A1 | 1/2022 | Kang et al. | |
| 2022/0026954 | A1 | 1/2022 | Choi et al. | |
| 2022/0287193 | A1 * | 9/2022 | Chun | H05K 5/0217 |
| 2022/0337688 | A1 * | 10/2022 | Sang | G06F 1/1652 |
| 2023/0036424 | A1 * | 2/2023 | Kim | G06F 1/1616 |
| 2023/0124270 | A1 | 4/2023 | Ko et al. | |
| 2024/0195896 | A1 | 6/2024 | Lee et al. | |
| 2024/0222873 | A1 * | 7/2024 | Shin | H01Q 13/02 |

FOREIGN PATENT DOCUMENTS

| | | | | | |
|---|---|---|---|---|---|
| KR | 10-2018-0007921 | A | | 1/2018 | |
| KR | 10-2019-0062855 | A | | 6/2019 | |
| KR | 10-2019-0101605 | A | | 9/2019 | |
| KR | 20190101605 | A | * | 9/2019 | H04M 1/0268 |
| KR | 10-2021-0031348 | A | | 3/2021 | |
| KR | 10-2021-0041380 | A | | 4/2021 | |
| KR | 10-2021-0118850 | A | | 10/2021 | |
| KR | 10-2021-0150178 | A | | 12/2021 | |
| KR | 10-2022-0008723 | A | | 1/2022 | |
| KR | 10-2022-0154153 | A | | 11/2022 | |
| KR | 10-2023-0150961 | A | | 10/2023 | |
| KR | 10-2023-0175210 | A | | 12/2023 | |
| WO | 2022/019357 | A1 | | 1/2022 | |

OTHER PUBLICATIONS

International Search Report with Written Opinion and English translation dated May 22, 2023; International Patent Application No. PCT/2023/002383.

* cited by examiner

ELECTRONIC DEVICE COMPRISING DRIVING MOTOR

CROSS-REFERENCE TO RELATED APPLICATION(S)

This application is a continuation application, claiming priority under § 365(c), of an International application No. PCT/KR2023/002383, filed on Feb. 20, 2023, which is based on and claims the benefit of a Korean patent application number 10-2022-0030583, filed on Mar. 11, 2022, in the Korean Intellectual Property Office, and of a Korean patent application number 10-2022-0083298, filed on Jul. 6, 2022, in the Korean Intellectual Property Office, the disclosure of each of which is incorporated by reference herein in its entirety.

BACKGROUND

1. Field

The disclosure relates to an electronic device including a drive motor.

2. Description of Related Art

Electronic devices are gradually becoming slimmer and more rigid, being strengthened in design aspects, and being improved to differentiate functional elements thereof. Electronic devices are being gradually transformed from a uniform rectangular shape into various shapes. An electronic device may have a transformable structure that is convenient to carry and enables the use of a large-screen display. The electronic device may have a structure capable of making the display area of a rollable display (e.g., a flexible display) variable by supporting housings that operate in a sliding manner relative to each other (e.g., a rollable structure or a slidable structure). This electronic device may include a drive module (e.g., a drive motor) configured to allow, with respect to one housing, a remaining housing to automatically slide.

The above information is presented as background information only to assist with an understanding of the disclosure. No determination has been made, and no assertion is made, as to whether any of the above might be applicable as prior art with regard to the disclosure.

SUMMARY

An electronic device may include a rollable electronic device in which the display area of a rollable display is expandable and/or contractible (e.g., a slidable electronic device). The rollable electronic device may include a first housing and a second housing that are coupled to each other to be movable relative to each other by being at least partially fitted together. For example, the first housing and the second housing operate slidably with respect to each other and support at least a portion of a rollable display (e.g., a flexible display, an expandable display, or a stretchable display), whereby, in a slide-in state, the rollable display may be guided to have a first display area, and in a slide-out state, the rollable display may be guided to have a second display area that is greater than the first display area.

The electronic device may include a manual slide module (e.g., a spring hinge module) that is disposed between the first housing and the second housing and is semi-automatically changed to the slide-in state or the slide-out state when pressed in a direction of being closed or opened beyond a predetermined inflection point. However, the manual sliding structure may interfere with a smooth sliding operation by the repulsive force of the rollable display and may be difficult to design to perform the sliding operation by uniformly distributing the repulsive force of the rollable display and the elastic force of the manual slide module (e.g., a spring hinge).

In order to solve these difficulties, the electronic device may include a drive motor including a pinion gear that operates the second housing to be automatically slidable with respect to the first housing held by a user, and a rack gear engaged with the pinion gear. When the drive motor is driven and the gearing operation is performed while the pinion gear and the rack gear are engaged with each other, the electronic device may automatically perform the sliding operation.

However, in the rollable electronic device, an efficient electrical connection structure between the drive motor and a board (e.g., a main board) disposed in the inner space, a structure to support the display during sliding operation, or the layout design of peripheral electronic components to improve the driving force of the drive motor is not being considered.

Aspects of the disclosure are to address at least the above-mentioned problems and/or disadvantages and to provide at least the advantages described below. Accordingly, an aspect of the disclosure is to provide an electronic device including a drive motor disposed to be efficiently connected to a board via a flexible printed circuit board.

Another aspect of the disclosure is to provide a rollable electronic device provided with a support structure configured to support a rollable display in a slide-in state.

Another aspect of the disclosure is to provide an electronic device including a drive motor that is capable of leading to efficient use of driving force by considering the layout structure with peripheral electronic components.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing slidably connected to the first housing, a rollable display disposed to be supported by the first housing and the second housing and having a display area contracted or expanded based on a slide-in or a slide-out state of the second housing, a support member disposed on the rear surface of the rollable display to support at least a portion of the rollable display, a first printed circuit board disposed in the first housing, a second printed circuit board disposed in the second housing, a flexible printed circuit board that connects the first printed circuit board and the second printed circuit board and is folded or unfolded based on the slide-in or slide-out state of the second housing, a drive motor disposed in the first housing, electrically connected to the first printed circuit board, and configured to provide a driving force to drive the second housing, a battery disposed in the first housing and configured to supply power to the drive motor, a pinion gear disposed in the first housing and configured to transmit power based on the driving force of the drive motor, and a rack gear disposed in the second housing to be engaged with the pinion gear.

In accordance with another aspect of the disclosure, an electronic device is provided. The electronic device includes a first housing including a first space formed through a first side surface member and a first printed circuit board disposed in the first space, a second housing slidably coupled to the first housing and including a second printed circuit board disposed in a second space formed through a second side surface member, a rear surface cover disposed on an outer surface of the first side surface member, at least one electronic component disposed between the first side surface member and the rear surface cover, a rollable display disposed to be supported by the first housing and the second housing, wherein the rollable display has a display area that is expanded when at least a portion of the second housing is switched from a slide-in state in which the at least a portion of the second housing is accommodated in the first space to a slide-out state in which the at least a portion of the second housing is moved in a direction, a third printed circuit board disposed in the first space and electrically connected via an expandable flexible printed circuit board extending from the second printed circuit board to the first space, a drive motor including a pinion gear electrically connected to the third printed circuit board at a position adjacent to the third printed circuit board in the first space, and a rack gear disposed in the second space and engaged with the pinion gear. The at least one electronic component is electrically connected to the second printed circuit board via a through hole formed in at least a portion of the first side surface member.

In accordance with another aspect of the disclosure, an electronic device is provided. The electronic device includes a first housing including a first side surface member and a first extension member extending from the first side surface member into a first space, a second housing slidably coupled to the first housing and including a second side surface member and a second extension member extending from the second side surface member to a second space, a rollable display disposed to be supported by the first housing and the second housing, wherein the rollable display has a display area that is expanded when at least a portion of the second housing is switched from a slide-in state in which the at least a portion of the second housing is accommodated in the first space to a slide-out state in which the at least a portion of the second housing is moved in the a direction, a support bracket disposed on at least a portion of the first extension member in the first space, a first printed circuit board disposed in the first housing, a second printed circuit board disposed in the second housing, a third printed circuit board disposed on the support bracket and electrically connected via an expandable flexible printed circuit board extending from the second printed circuit board to the first space, a drive motor including a pinion gear electrically connected to the third printed circuit board at a position adjacent to the third printed circuit board on the support bracket, and a rack gear disposed in the second space and engaged with the pinion gear. The drive motor is electrically connected to the second printed circuit board via the third printed circuit board and the expandable flexible printed circuit board, and in the slide-in state, the drive motor is disposed at an edge of the support bracket closest to the second printed circuit board.

According to various embodiments of the disclosure, an electronic device includes the second housing operating in a sliding manner with respect to the first housing, and includes a drive motor disposed at an edge in the slide-out direction in the inner space of the first housing and connected to the printed circuit board disposed in the inner space of the second housing. As a result, operational reliability can be improved by minimizing the electrical connection structure between the printed circuit board and the drive motor disposed in different housings.

In addition, an electronic device includes a battery disposed in the inner space of the first housing to support at least a portion of the rollable display in the slide-out state. As a result, the operational reliability of the electronic device can be improved.

In addition, an electronic device includes a drive motor and a battery disposed in the inner space of the first housing. As a result, the weight of the second housing can be made relatively light, and the sliding operation of the second housing can be induced with minimal power consumption.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying the drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display driver integrated circuit (IC), an audio CODEC chip, a universal serial bus (USB) controller, a camera controller, an image processing IC, a microprocessor unit (MPU), a system on chip (SoC), an IC, or the like.

Figure 1:
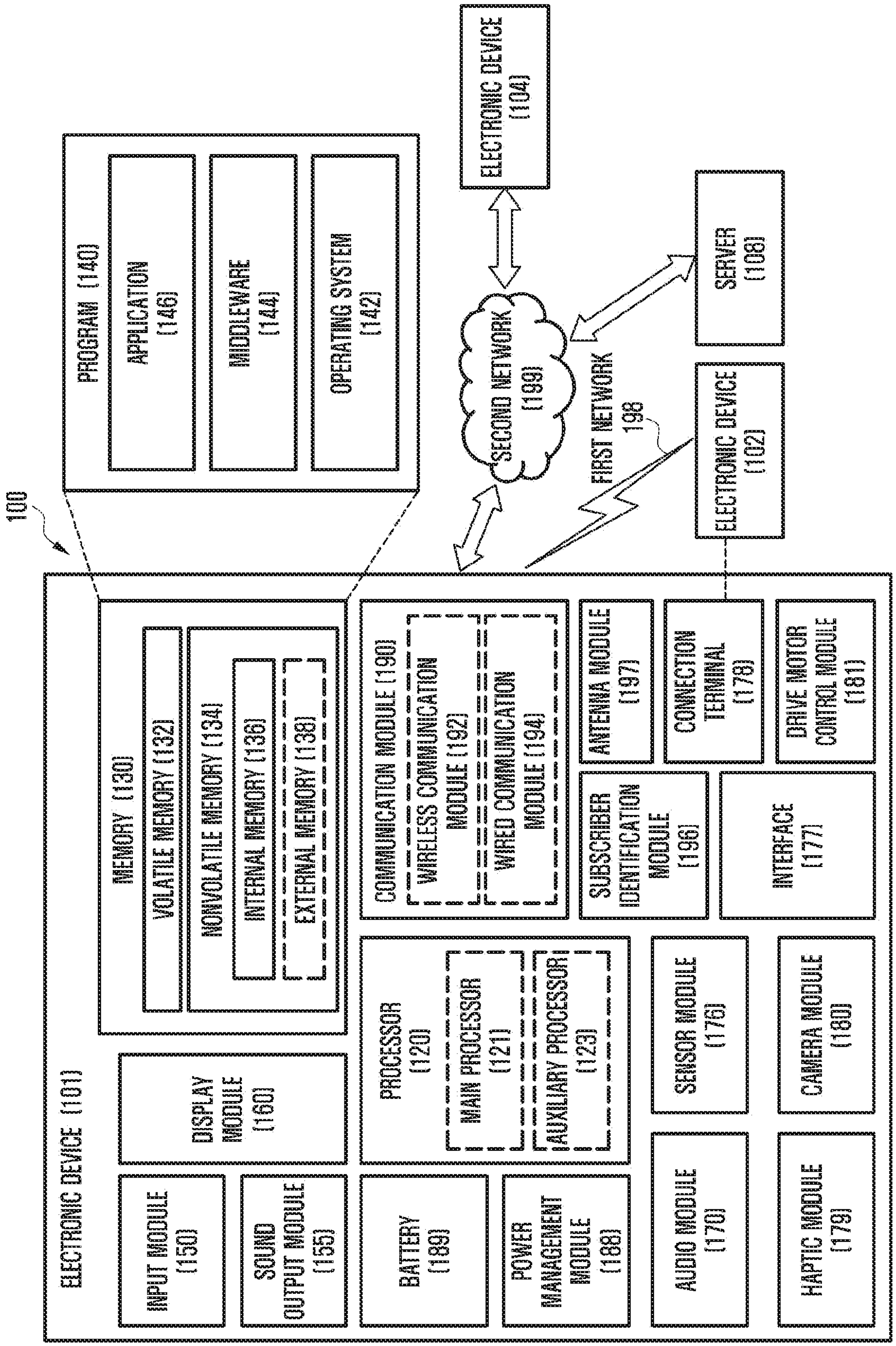
FIG. 1 is a block diagram of an electronic device in a network environment according to an embodiment of the disclosure.

FIG. 1 is a block diagram illustrating an electronic device 101 in a network environment 100 according to an embodiment of the disclosure.

With reference to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include internal memory 136 or external memory 138.

The program 140 may be stored in the memory 130 as software, and may include, For example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, For example, a microphone, a mouse, a keyboard, a key (e.g., a button), or a digital pen (e.g., a stylus pen).

The sound output module 155 may output sound signals to the outside of the electronic device 101. The sound output module 155 may include, For example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, For example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, For example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, For example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, For example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, For example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, For example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a lateral) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic device 102 or 104 may be a device of a same type as, or a different type, from the electronic device 101. According to an embodiment, all or some of operations to be executed at the electronic device 101 may be executed at one or more of the external electronic device 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The electronic device 101 may provide the outcome, with or without further processing of the outcome, as at least part of a reply to the request. To that end, a cloud computing, distributed computing, mobile edge computing (MEC), or client-server computing technology may be used, For example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) on the basis of 5G communication technology or IoT-related technology.

Figure 4:
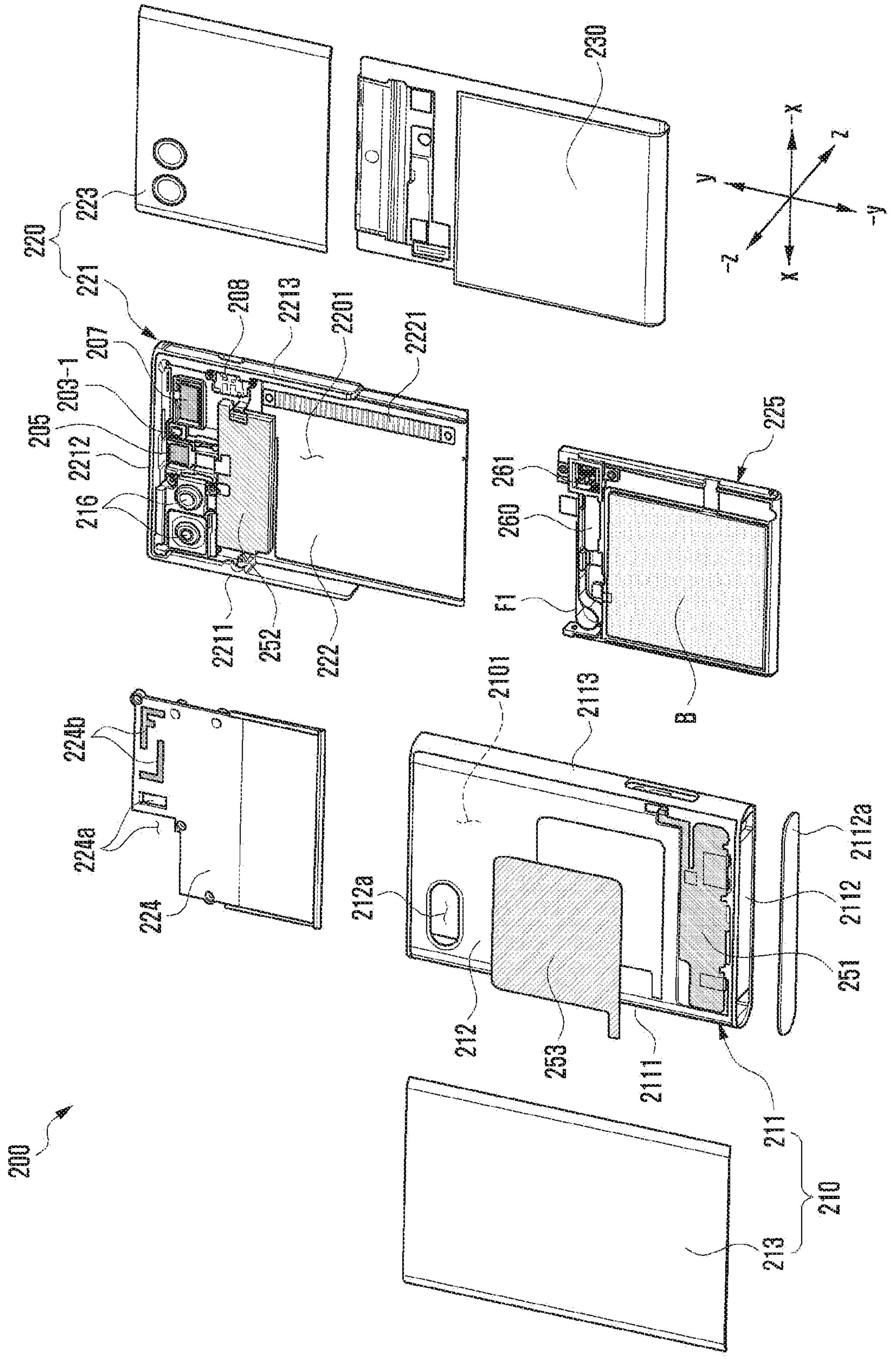
FIG. 4 is an exploded perspective view of the electronic device according to an embodiment of the disclosure.

According to various embodiments, the sensor module 176 may include a movement distance detection sensor to detect a movement distance of a second housing (e.g., a second housing 220 in FIG. 4) from a first housing (e.g., a first housing 210 in FIG. 4) of an electronic device (e.g., an electronic device 200 of FIG. 4). In one embodiment, through movement of the second housing 220 from the first housing 210, the sensor module 176 may detect a slide-in state being a first state, a slide-out state being a second state, or an intermediate state being a third state between the slide-in state and the slide-out state. In a certain embodiment, the processor 120 may detect the movement distance in real time through the sensor module 176 while the second housing 220 is moved from the first housing 210, and control the display module 160 to display an object in correspondence to the changing display area through a flexible display (e.g., rollable display 230 in FIG. 4). In one embodiment, the electronic device 101 may include a drive motor control module 181 to control the operation of a drive motor (e.g., DC motor or stepping motor) (e.g., drive motor 260 in FIG. 4) disposed inside the electronic device. In an embodiment, the drive motor control module 181 may be replaced by the processor 120.

Figure 2A:
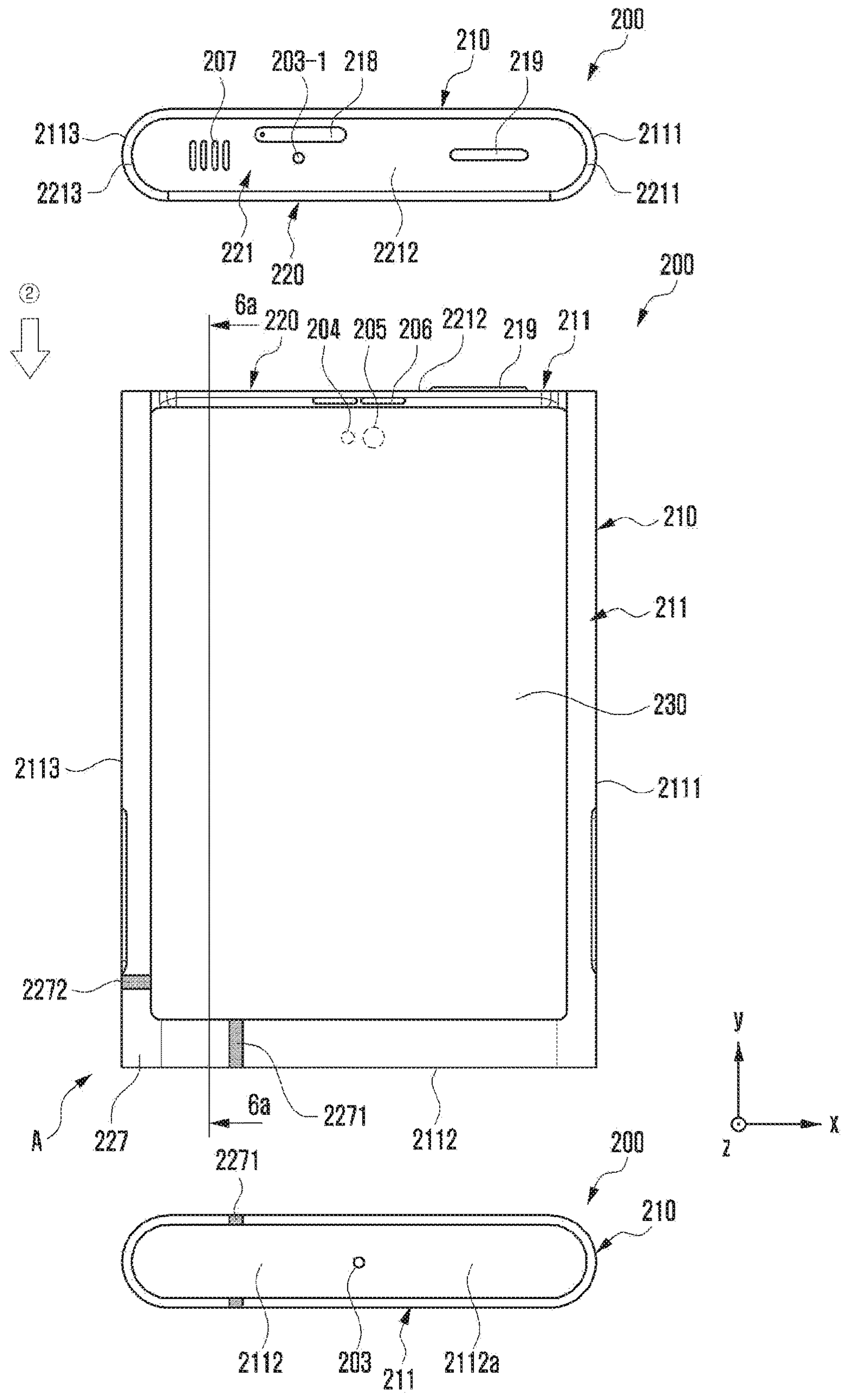
FIGS. 2A and 2B are views illustrating front and rear surfaces of an electronic device in a slide-in state according to various embodiments of the disclosure.
Figure 2B:
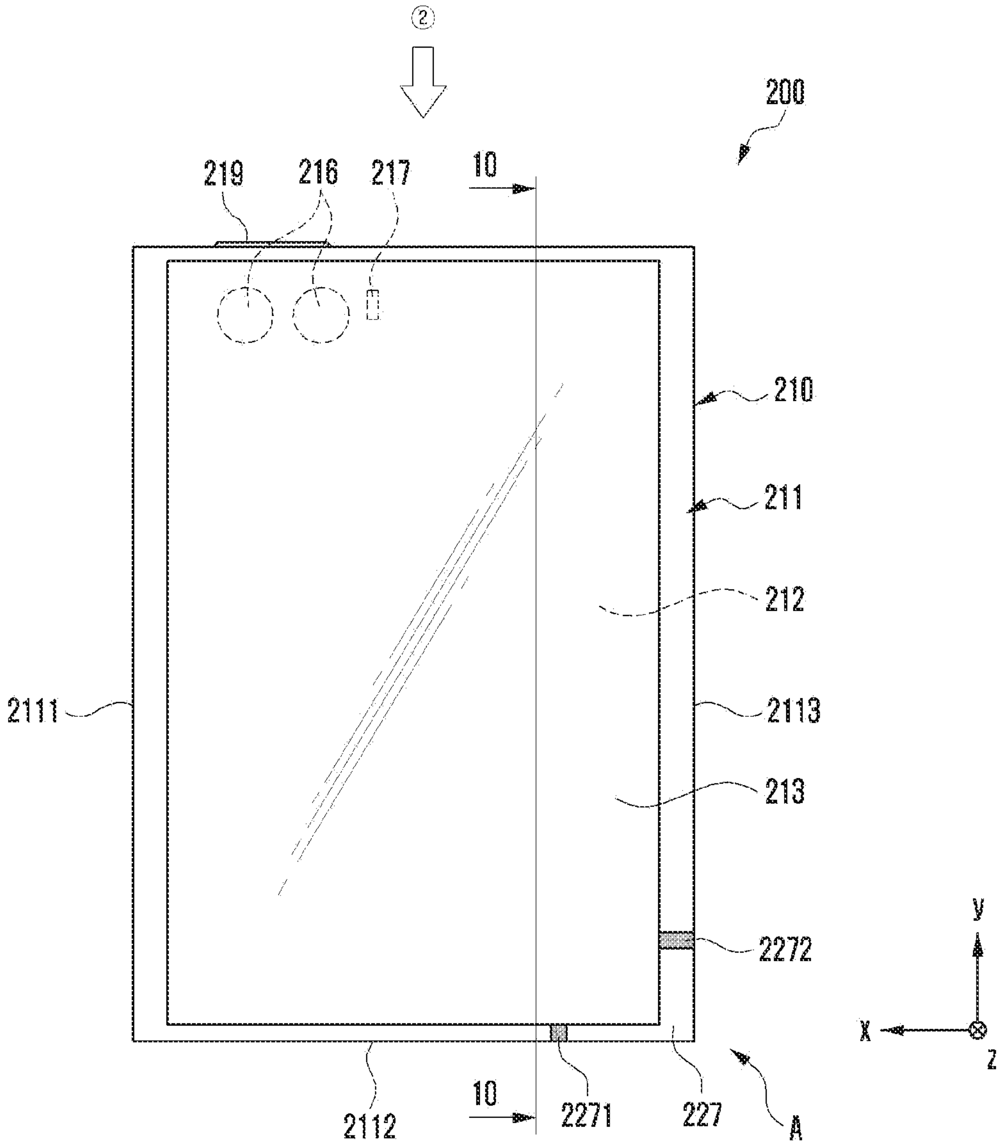

FIGS. 2A and 2B are views illustrating front and rear surfaces of an electronic device according to various embodiments of the disclosure in a slide-in state according to various embodiments of the disclosure.

Figure 3A:
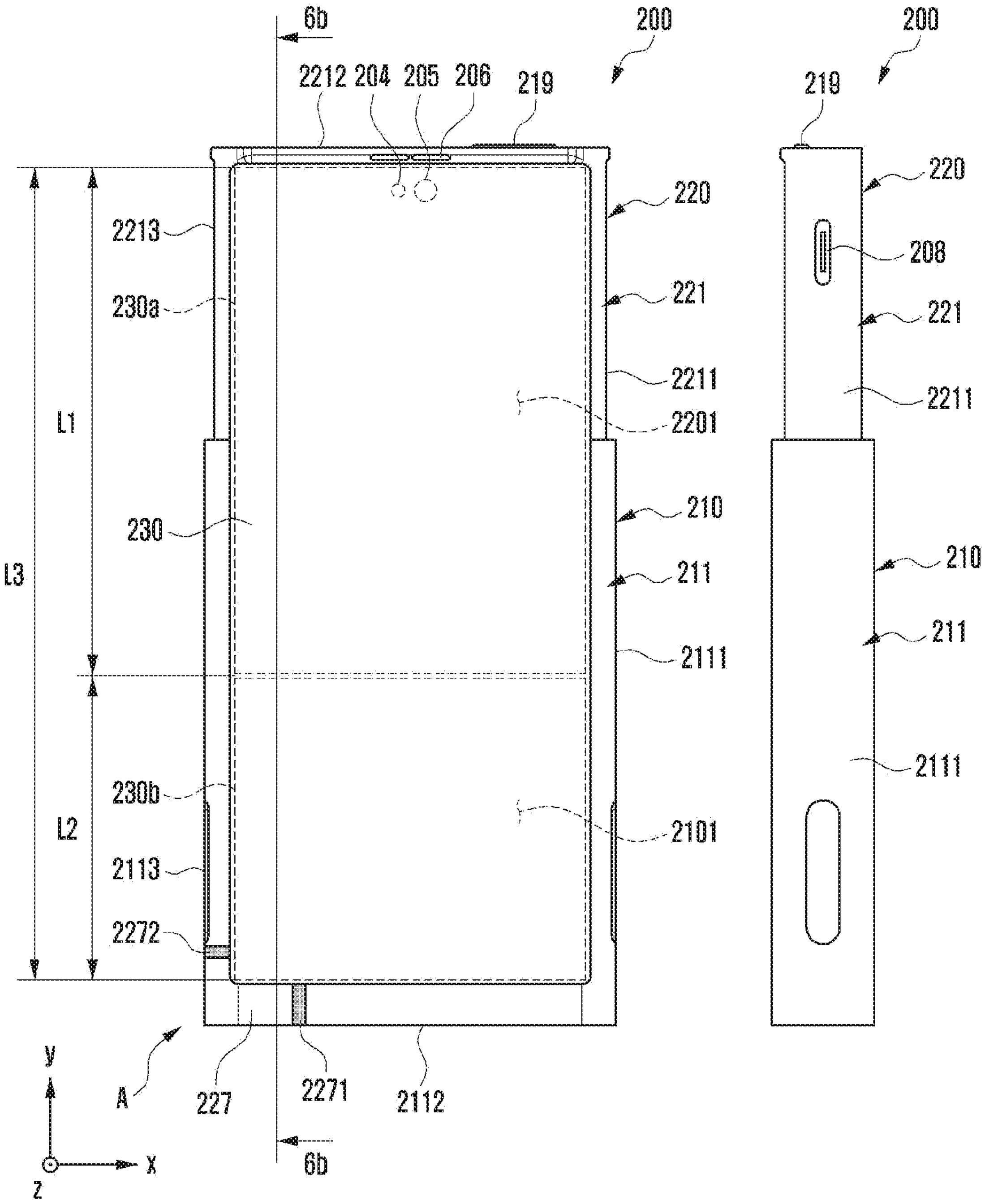
FIGS. 3A and 3B are views illustrating front and rear surfaces of the electronic device in a slide-out state according to various embodiments of the disclosure.
Figure 3B:
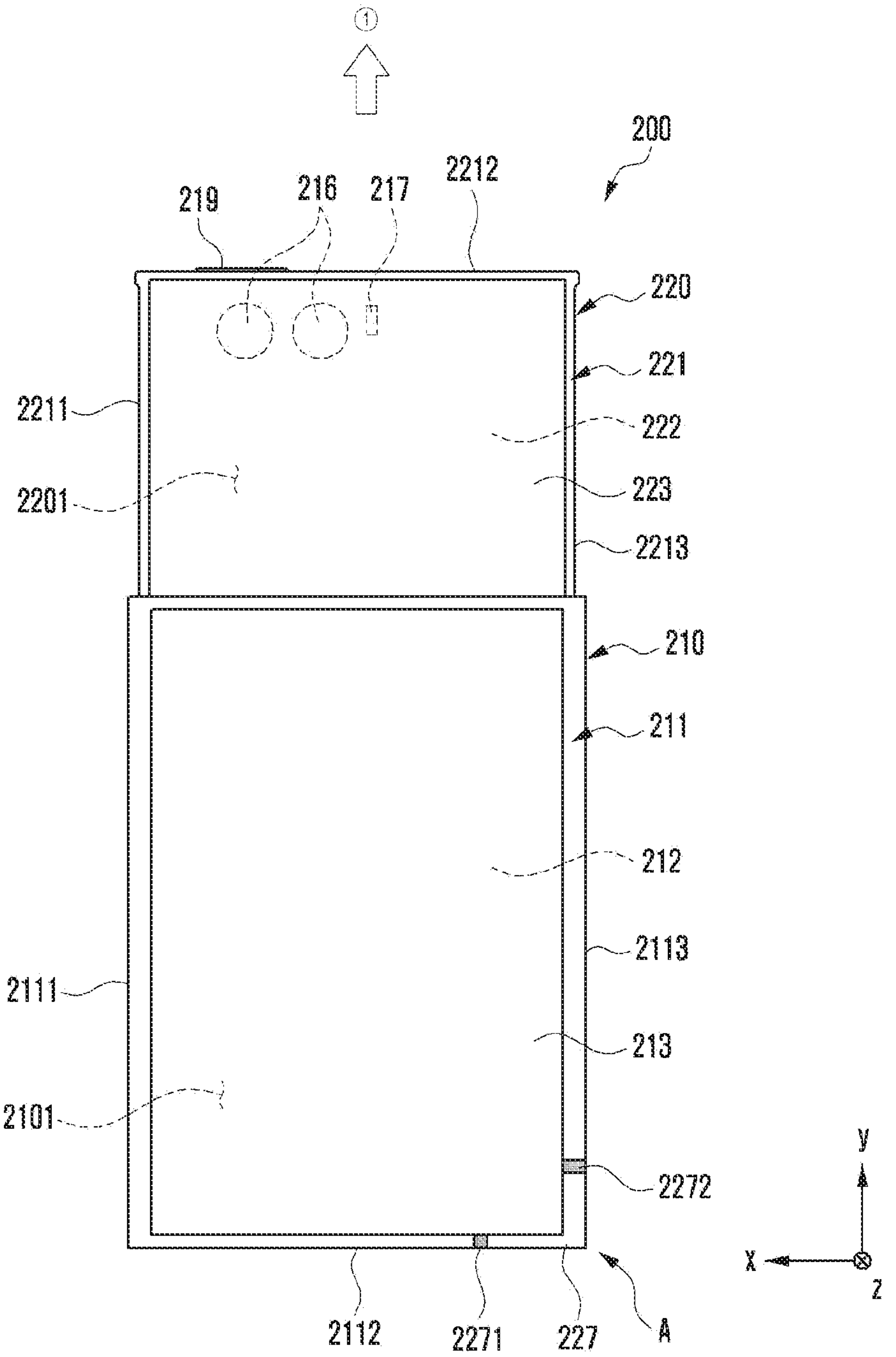

FIGS. 3A and 3B are views illustrating front and rear surfaces of the electronic device in a slide-out state according to various embodiments of the disclosure.

The electronic device 200 of FIGS. 2A, 2B, 3A and 3B may be at least partially similar to the electronic device 101 of FIG. 1 or may further include other embodiments of the electronic device.

Referring to FIGS. 2A, 2B, 3A and 3B, the electronic device 200 may include a first housing 210, a second housing 220 (e.g., a second housing structure, a fixed part, or a base housing) coupled to be slidable in a predetermined direction (e.g., in direction ① or direction ②) (e.g., the ±y-axis direction) from the first housing 210, and a rollable display 230 (e.g., a flexible display, an expandable display, or a stretchable display) disposed to be supported by at least a portion of the first and second housings 210 and 220. According to an embodiment, the electronic device 200 may be configured such that, with respect to the first housing 210 held by a user, the second housing 220 slides out in a first direction (direction ①) or in a second direction (direction ②) opposite to the first direction (direction ①). According to an embodiment, at least a portion of the second housing 220 including a second space 2201 may be changed into the slide-in state by being accommodated in the first space 2101 of the first housing 210. According to an embodiment, the electronic device 200 may include a support member (e.g., the support member 240 in FIG. 4) (e.g., a bendable member, an articulated hinge module or a multi-bar structure) configured to be at least partially flush with at least a portion of the second housing 220 in the slide-out state and at least partially accommodated in the first space 2101 of the first housing 210 in the slide-in state. According to an embodiment, in the slide-in state, at least a portion of the rollable display 230 may be accommodated into the first space 2101 of the first housing 210 in a bending manner while being supported by the support member (e.g., the support member 240 in FIG. 4), thereby being disposed to be invisible from the outside. According to an embodiment, in the slide-out state, at least a portion of the rollable display 230 may be disposed to be visible from the outside while being supported by the support member (e.g., the support member 240 in FIG. 4), which is at least partially coplanar with the second housing 220.

According to various embodiments, the electronic device 200 may include a first housing 210 including a first side surface member 211 and a second housing 220 including a second side surface member 221. According to an embodiment, the first side surface member 211 may include a first side surface 2111 having a first length along a first direction (e.g., the y-axis direction), a second side surface 2112 extending from the first side surface 2111 along a direction substantially perpendicular to the first side surface 2111 (e.g., the x-axis direction) to have a second length smaller than the first length, and a third side surface 2113 extending from the second side surface 2112 to be substantially parallel to the first side surface 2111 and having the first length. According to an embodiment, at least a portion of the first side surface member 211 may be made of a conductive member (e.g., metal). In some embodiments, the first side surface member 211 may be formed by coupling a conductive member and a non-conductive member (e.g., polymer). According to an embodiment, the first housing 210 may include a first extension member 212 extending from at least a portion of the first side surface member 211 to at least a portion of the first space 2101. According to an embodiment, the first extension member 212 may be configured integrally with the first side surface member 211. In some embodiments, the first extension member 212 may be formed separately from the first side surface member 211 and structurally coupled to the first side surface member 211.

According to various embodiments, the second side surface member 221 may include a fourth side surface 2211 at least partially corresponding to the first side surface 2111 and having a third length, a fifth side surface 2212 extending from the fourth side surface 2211 in a direction substantially parallel to the second side surface 2112 and having a fourth length greater than the third length, and a sixth side surface 2213 extending from the fifth side surface 2212 to correspond to the third side surface 2113 and having the third length. According to an embodiment, at least a portion of the second side surface member 221 may be formed of a conductive member (e.g., metal). In some embodiments, the second side surface member 221 may be configured by coupling a conductive member and a non-conductive member (e.g., polymer). According to an embodiment, at least a portion of the second side surface member 221 may include a second extension member 222 extending to at least a portion of the second space 2201 of the second housing 220. According to an embodiment, the second extension member 222 may be formed integrally with the second side surface member 221. In some embodiments, the second extension member 222 may be formed separately from the second side surface member 221 and structurally coupled to the second side surface member 221.

According to various embodiments, the first side surface 2111 and the fourth side surface 2211 may be slidably coupled to each other. According to an embodiment, the third side surface 2113 and the sixth side surface 2213 may be slidably coupled to each other. According to an embodiment, in the slide-in state, the fourth side surface 2211 may be disposed to be substantially invisible from the outside by overlapping the first side surface 2111. According to an embodiment, in the slide-in state, the sixth side surface 2213 may be disposed to be substantially invisible from the outside by overlapping the third side surface 2113. In some embodiments, at least a portion of the fourth and sixth side surfaces 2211 and 2213 may be disposed to be at least partially visible from the outside in the slide-in state. According to an embodiment, in the slide-in state, the second extension member 222 may be disposed to be substantially invisible from the outside by overlapping the first extension member 212.

According to various embodiments, the first housing 210 may include a first rear surface cover 213 coupled to at least a portion of the first side surface member 211. According to an embodiment, the first rear surface cover 213 may be disposed in a manner of being coupled to at least a portion of the first extension member 212. In some embodiments, the first rear surface cover 213 may be formed integrally with the first side surface member 211. According to an embodiment, the first rear surface cover 213 may be formed of a polymer, coated or tinted glass, ceramic, a metal (e.g., aluminum, stainless steel (STS), or magnesium), or a combination of at least two of these materials. In some embodiments, the first rear surface cover 213 may extend to at least a portion of the first side surface member 211. In some embodiments, at least a portion of the first extension member 212 may be replaced with the first rear surface cover 213.

According to various embodiments, the second housing 220 may include a second rear surface cover 223 coupled to at least a portion of the second side surface member 221. According to an embodiment, the second rear surface cover 223 may be disposed in a manner of being coupled to at least a portion of the second extension member 222. In some embodiments, the second rear surface cover 223 may be formed integrally with the second side surface member 221. According to an embodiment, the second rear surface cover 223 may be formed of a polymer, coated or tinted glass, ceramic, a metal (e.g., aluminum, stainless steel (STS), or magnesium), or a combination of at least two of these materials. In some embodiments, the second rear surface cover 223 may extend to at least a portion of the second side surface member 221. In some embodiments, at least a portion of the second extension member 222 may be replaced with the second rear surface cover 223.

According to various embodiments, the electronic device 200 may include a rollable display 230 disposed to be supported by at least a portion of the first housing 210 and at least a portion of the second housing 220. According to an embodiment, the rollable display 230 may include a first portion **230*a* (e.g., a flat portion) that is always visible from the outside, and a second portion 230*b* (e.g., a bendable portion) extending from the first portion 230*a* and at least partially accommodated in the first space 2101 of the first housing 210 to be invisible from the outside in the slide-in state. According to an embodiment, the first portion 230*a* may be disposed to be supported by the second housing 220, and the second portion 230*b* may be disposed to be at least partially supported by the support member (e.g., the support member 240 in FIG. 4). According to an embodiment, in the state in which the second housing 220 is slid out along the first direction (direction ①), the second portion 230*b* of the rollable display 230 may extend from the first portion 230*a* while being supported by the support member (e.g., the support member 240 in FIG. 4), and may be disposed to be substantially flush with the first portion 230*a* and to be visible from the outside. According to an embodiment, in the state in which the second housing 220 is slid in along the second direction (direction ②), the second portion 230*b* of the rollable display 230 may be disposed to be accommodated in the first space 2201 of the first housing 210 in the manner of being bent and to be invisible from the outside. Accordingly, in the electronic device 200, the display area of the rollable display 230 may be variable since the second housing 220 is moved in a sliding manner from the first housing 210** in a predetermined direction (e.g., the ±y-axis direction).

According to various embodiments, the rollable display 230 may be variable in length in the first direction (direction ①) depending on the sliding of the second housing 220 that moves with respect to the first housing 210. For example, in the slide-in state, the rollable display 230 may have a first display area corresponding to a first length L1 (e.g., an area corresponding to the first portion **230*a*). According to an embodiment, in the slide-out state, according to the sliding of the second housing 220 further moved by a second length L2 with respect to the first housing 210, the rollable display 230 may be expanded to have a third display area (e.g., an area including the first portion 230*a* and the second portion 230*b*), which corresponds to a third length L3 longer than the first length L1** and is larger than the first display area.

According to various embodiments, the electronic device 200 may include at least one of an input device (e.g., a microphone 203-1) disposed in the second space 2201 of the second housing 220, a sound output device (e.g., a phone call receiver 206 and/or a speaker 207), sensor modules 204 and 217, a camera module (e.g., the first camera module 205 or the second camera module 216), a connector port 208, a key input device 219, a SIM tray 218, or an indicator (not illustrated). According to an embodiment, the electronic device 200 may include another input device (e.g., the microphone 203) disposed in the first housing 210. As another embodiment, the electronic device 200 may be configured such that at least one of the above-mentioned components is omitted or other components are additionally included. In another embodiment, at least one of the above-described components may be disposed in the first space 2101 of the first housing 210.

According to various embodiments, the input device may include a microphone 203-1. In some embodiments, the input device (e.g., the microphone 203-1) may include a plurality of microphones arranged to detect the direction of sound. The sound output device may include, for example, a call receiver 206 and a speaker 207. According to an embodiment, regardless of the slide-in/slide-out state, the speaker 207 may correspond to the outside through at least one speaker hole provided in the second housing 220 at a position always exposed to the outside (e.g., the fifth side surface 2212). According to an embodiment, in the slide-out state, the connector port 208 may correspond to the outside through a connector port hole provided in the second housing 220. In some embodiments, in the slide-in state, the connector port 208 may face the outside through an opening provided in the first housing 210 to correspond to the connector port hole. In some embodiments, the call receiver 206 may include a speaker that is operated without a separate speaker hole (e.g., a piezo speaker).

According to various embodiments, the sensor modules 204 and 217 may generate electrical signals or data values corresponding to an internal operating state or an external environmental state of the electronic device 200. The sensor modules 204 and 217 may include, for example, a first sensor module 204 (e.g., a proximity sensor or an illuminance sensor) disposed on the front surface of the electronic device 200 and/or a second sensor module 217 (e.g., a heart rate monitoring (HRM) sensor) disposed on the rear surface of the electronic device 200. According to an embodiment, the first sensor module 204 may be disposed under the rollable display 230 in the front surface of the electronic device 200. According to an embodiment, the first sensor module 204 and/or the second sensor module 217 may include at least one of a proximity sensor, an illuminance sensor, a time-of-flight (TOF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various embodiments, the camera module may include a first camera module 205 disposed on the front surface of the electronic device 200 and a second camera module 216 disposed on the rear surface of the electronic device 200. According to an embodiment, the electronic device 200 may include a flash (not illustrated) located near the second camera module 216. According to an embodiment, the first and second camera modules 216 and 205 may include one or more lenses, an image sensor, and/or an image signal processor. In an embodiment, the first camera module 205 may be disposed under the rollable display 230 and may be configured to photograph a subject through a portion of an active area (e.g., a display area) of the rollable display 230.

According to various embodiments, the first camera module 205 among the camera modules and some sensor modules 204 among the sensor modules 204 and 217 may be disposed to detect the external environment through the rollable display 230. For example, the first camera module 205 or some sensor modules 204 may be disposed in the second space 2201 in the second housing 220 to be in contact with the external environment through a transmission area or a perforated opening provided in the rollable display 230. According to an embodiment, the area of the rollable display 230, which faces the first camera module 205, may be configured as a transmission area having a predetermined transmittance as a portion of display area for displaying contents. According to an embodiment, the transmission area may have a transmittance ranging from about 5% to about 20%. The transmission area may include an area overlapping an effective area (e.g., a field of view area) of the first camera module 205 through which light imaged by an image sensor to generate an image passes. For example, the transmission area of the rollable display 230 may include an area having a lower pixel density and/or a lower wire density than the surrounding area. For example, the transmission area may replace the above-mentioned opening. For example, the first camera module 205 may include an under-display camera (UDC). In some embodiments, the sensor module 204 may be disposed to execute its function in the inner space of the electronic device 200 without being visually exposed through the rollable display 230.

According to various embodiments, the electronic device 200 may include at least one antenna element (e.g., the antenna element 214*b* in FIG. 4) electrically connected to a wireless communication circuit (e.g., the wireless communication module 192 in FIG. 1) disposed in the second housing 220. According to an embodiment, the electronic device 200 may include a bezel antenna A disposed through the conductive first side surface member 211 of the first housing 210. For example, the bezel antenna A may include a conductive portion 227 disposed in at least a portion of the second and third side surfaces 2112 and 2113 of the first side surface member 211 and electrically split by one or more split portions 2271 and 2272 made of a non-conductive material (e.g., polymer). According to an embodiment, the wireless communication circuit (e.g., the wireless communication module 192 in FIG. 1) may be configured to transmit or receive a wireless signal in at least one predetermined frequency band (e.g., about 600 MHz to 9000 MHz) (e.g., a legacy band or NR band) via the conductive portion 227. According to an embodiment, the electronic device 200 may include a side surface cover 2112*a* disposed on the second side surface 2112 to cover at least a portion of the at least one split portion 2271. In some embodiments, the bezel antenna A may be disposed on at least one of the first side surface 2111, the second side surface 2112, and the third side surface 2113. In some embodiments, the bezel antenna A may be disposed on at least one of the fourth side surface 2211, the fifth side surface 2212, and the sixth side surface 2213 of the second housing 220. In some embodiments, the electronic device 200 may further include at least one antenna module (e.g., a 5G antenna module or an antenna structure) disposed in the inner space (e.g., the second space 2201 or the first space 2101) and configured to transmit or receive a wireless signal of a frequency band ranging from about 3 GHz to 100 GHz via another wireless communication circuit (e.g., the wireless communication module 192 in FIG. 2). In some embodiments, the wireless communication circuit may be disposed in the first housing 210.

According to various embodiments, the slide-in/slide-out operation of the electronic device 200 may be automatically performed. For example, the slide-in/slide-out operation of the electronic device 200 may be executed via gear engagement between a drive motor (e.g., the drive motor 260 in FIG. 4) including a pinion gear (e.g., the pinion gear 261 in FIG. 4) disposed in the first space 2101 of the first housing 210 and a rack gear (e.g., the rack gear 2221 in FIG. 4) disposed in the second space 2201 of the second housing 220 and engaged with the pinion gear 261. For example, when detecting a triggering operation of switching from the slide-in state to the slide-out state or from the slide-out state to the slide-in state, the processor (e.g., the processor 120 in FIG. 1) of the electronic device 200 may operate the drive motor (e.g., the drive motor 260 in FIG. 4) disposed inside the electronic device 200. According to an embodiment, the triggering operation may include selecting (e.g., touching) an object displayed on the rollable display 230 or operating a physical button (e.g., a key button) included in the electronic device 200.

An electronic device 200 according to an embodiment of the disclosure may include a drive motor (e.g., the drive motor 260 in FIG. 4) disposed in the first space 2101 of the first housing 210 at an edge closest to the second space 2201 of the second housing 220 in the slide-out direction (direction ①) and include an electrical connection structure electrically connected to a second printed circuit board (e.g., the second printed circuit board 252 in FIG. 4) disposed in the second space 2201 via a flexible printed circuit board (e.g., the flexible printed circuit board F1 in FIG. 9A), so that an electrical connection structure between the second printed circuit board 252 and the drive motor 260, which are disposed in different housings 210 and 220, respectively, may be minimized to improve operational reliability. According to an embodiment, the electronic device 200 may include a battery (e.g., the battery B in FIG. 4) disposed in the first space 2101 of the first housing 210 to support at least a portion of the rollable display 230 in the slide-out state, which may help improve the operational reliability of the electronic device 200. According to an embodiment, since the electronic device 200 includes the drive motor 260 and the battery B disposed in the first space 2101 of the first housing 210, the second housing 220 may be made relatively light and minimize driving resistance. As a result, sliding operation of the second housing 220 can be induced with minimal power consumption.

Hereinafter, a detailed description will be made below.

FIG. 4 is an exploded perspective view of the electronic device according to an embodiment of the disclosure.

In describing the electronic device 200 of FIG. 4, components that are substantially the same as those of the electronic device 200 of FIGS. 2A, 2B, 3A and 3B may be assigned with the same reference numerals, and a detailed description thereof may be omitted.

Referring to FIG. 4, the electronic device 200 may include a first housing 210 including a first space 2101, a second housing 220 coupled to be slidable from the first housing 210 and including a second space (e.g., the second space 2201 in FIG. 3A), a support member (e.g., the support member 240 in FIG. 5B) pivotably disposed in a manner of being at least partially bent in the second space 2201, a rollable display 230 disposed to be supported by at least a portion of the support member 240 and the second housing 220, and a drive module configured to drive the second housing 220 in a slide-in direction (e.g., the −y-axis direction) and/or a slide-out direction (e.g., the y-axis direction) relative to the first housing 210. According to an embodiment, the first housing 210 may include a first side surface member 211, and a first rear surface cover 213 coupled with at least a portion of the first side surface member 211 (e.g., at least a portion of the first extension member 212). According to an embodiment, the second housing 220 may include a second side surface member 221, and a second rear surface cover 223 coupled with at least a portion of the second side surface member 221 (e.g., at least a portion of the second extension member 222). According to an embodiment, the drive module may include a drive motor 260 disposed in the first space 2101 and including a pinion gear (e.g., the pinion gear 261 in FIG. 5A), and a rack gear 2221 disposed in the second space 2201 to be engaged with the pinion gear 261. According to an embodiment, the drive module may further include a reduction module including a plurality of gear assemblies arranged to reduce a rotation speed and increase a driving force by being coupled to the drive motor 260. According to an embodiment, the drive motor 260 may be disposed to be supported via at least a portion of a support bracket 225 disposed in the first space 2101 of the first housing 210. According to an embodiment, the drive motor 260 may be fixed to an end (e.g., an edge) of the support bracket 225 in the slide-out direction (e.g., the y-axis direction) in the first space 2101.

According to various embodiments, the electronic device 200 may include at least one electronic component disposed in the second space 2201. According to an embodiment, the at least one electronic component may include a first printed circuit board 251 disposed in the first housing 210, and a second printed circuit board 252 disposed in the second housing. According to an embodiment, the at least one electronic component may include a camera module 216, a speaker 207, a connector port 208, and a microphone 203-1 arranged around the second printed circuit board 252 in the second space 2201. According to an embodiment, since the at least one electronic component is disposed around the second printed circuit board 252 in the second space 2201 of the second housing 220, efficient electrical connection may be possible.

According to various embodiments, the electronic device 200 may include a rear bracket 224 disposed to cover at least some of multiple electronic components disposed between the second extension member 222 and the second rear surface cover 223 in second housing 220. According to an embodiment, the rear bracket 224 may be structurally coupled to at least a portion of the second extension member 222. In some embodiments, the rear bracket 224 may be omitted. According to an embodiment, the rear bracket 224 may be disposed to cover at least one electronic component and to support the second rear surface cover 223. According to an embodiment, the rear bracket 224 may include a notch area **224*a* or an opening 224*a* (e.g., a through hole) provided in an area corresponding to the camera module 216 and/or the sensor module (e.g., the sensor module 217 in FIG. 3B). According to an embodiment, the rear bracket 224 may include at least one antenna element 224*b*. According to an embodiment, when the rear bracket 224 is a dielectric injection-molded product (e.g., an antenna carrier), the at least one antenna element 224*b* may be disposed on the outer surface of the rear bracket 224. According to an embodiment, the at least one antenna element 224*b* may include a laser direct structuring (LDS) antenna pattern provided on the outer surface of the rear bracket 224. In some embodiments, the at least one antenna element 224*b* may include a conductive plate attached to the outer surface of the rear bracket 224 or a conductive paint or conductive pattern provided on the outer surface. In some embodiments, the at least one antenna element 224*b* may be disposed in a built-in manner when the rear bracket 224 is injection-molded. According to an embodiment, the at least one antenna element 224*b* may be configured to transmit or receive a wireless signal in a predetermined frequency band (e.g., a legacy band) by being electrically connected to a wireless communication circuit (e.g., the wireless communication module 192 in FIG. 1) disposed on the first printed circuit board 251. According to an embodiment, the camera module 216 and/or the sensor module 217 may be arranged to detect an external environment through the notch area 224*a* or the opening 224*a*. According to an embodiment, the second rear surface cover 223 may be processed to be transparent in an area corresponding to at least the camera module 216 and/or the sensor module 217. In some embodiments, the camera module 216 and/or the sensor module 217 may be configured to operate only when the electronic device 200** is in the slide-out state.

According to various embodiments, the electronic device 200 may include a support bracket 225 disposed in the first space 2101 of the first housing 210. According to an embodiment, the support bracket 225 may include a support portion 2252 disposed at one edge and having an outer surface bent in a curved shape to support the rear surface of the support member 240, which is bent during the sliding operation. According to an embodiment, the support bracket 225 may include a support structure configured to support and fix the drive motor 260. According to an embodiment, the drive motor 260 may be disposed at the end (e.g., an edge) of the support bracket 225 in the slide-out direction (e.g., the y-axis direction). For example, when the assembly of the electronic device 200 is completed, the drive motor 260 is disposed at a position closest to the second printed circuit board 252 among the electronic components disposed in the first housing 210. As a result, it is possible to minimize the size and/or the length of the flexible printed circuit board F1 electrically interconnecting the second printed circuit board 252 and the drive motor 260. According to an embodiment, the electronic device 200 may include a pair of guide rails (e.g., the guide rails 226 in FIG. 5A) disposed on opposite side surfaces of the support bracket 225 to guide the opposite ends of the support member 240 in the sliding direction.

According to various embodiments, the first housing 210 may include an opening **212*a* (e.g., a through hole) disposed in an area corresponding to the camera module 216 and/or the sensor module 217 disposed in the second housing 220 when the electronic device 200 is in the slide-in state in the first extension member 212. According to an embodiment, when the electronic device 200 is in the slide-in state, the camera module 216 and/or the sensor module 217 may detect an external environment through the opening 212*a* provided in the first housing 210. In this case, an area of the first rear surface cover 213 corresponding to at least the camera module 216 and/or the sensor module 217** may be processed to be transparent.

According to various embodiments, the electronic device 200 may include a first printed circuit board 251 and an antenna member 253 disposed between the first extension member 212 and the first rear surface cover 213 in the first housing 210. According to an embodiment, the first printed circuit board 251 and the antenna member 253 may be disposed on at least a portion of the first extension member 212. According to an embodiment, the first printed circuit board 251 and the antenna member 253 may be electrically connected to the second printed circuit board 252 via at least one flexible printed circuit board (FPCB) (or flexible RF cable (FRC)). According to an embodiment, the antenna member 253 may include a multi-function coil or multi-function core (MFC) antenna configured to execute a wireless charging function, a neat field communication (NFC) function, and/or an electronic payment function. In some embodiments, the antenna member 253 may be electrically connected to the first printed circuit board 251, thereby being electrically connected to the second printed circuit board 252 via the first printed circuit board 251. In some embodiments, the first printed circuit board 251 and/or the antenna member 253 may be electrically connected to the second printed circuit board 252 via at least a portion of the flexible printed circuit board F1 connecting the drive motor 260 and the second printed circuit board 252 to each other.

Figure 5A:
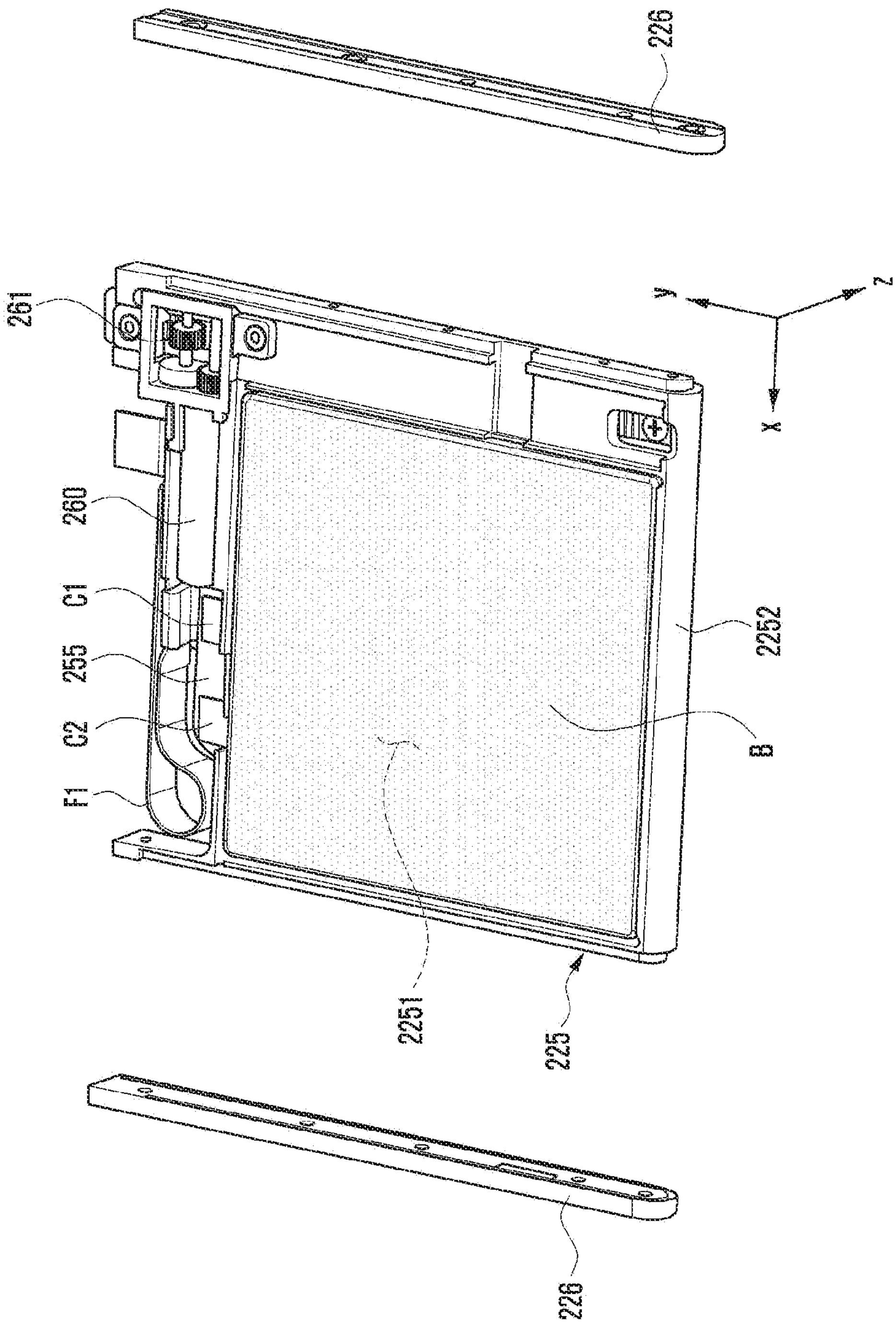
FIG. 5A is a view illustrating an arrangement structure of electronic components included in the support bracket according to an embodiment of the disclosure.

FIG. 5A is a view illustrating an arrangement structure of electronic components included in the support bracket according to an embodiment of the disclosure.

Referring to FIG. 5A, the support bracket 225 may include a battery seating portion 2251 configured to accommodate a battery B, and a drive motor 260 disposed around the battery seating portion 2251 and including a pinion gear 261. In some embodiments, the battery seating portion 2251 may be disposed to be supported via a partition wall that at least partially extends from the outer surface of the support bracket 225. In some embodiments, the battery B may be fixed to at least a portion of the support bracket 225 through an adhesion process such as bonding or taping, without a separate partition wall.

According to various embodiments, the electronic device 200 may include, in the support bracket 225, a third printed circuit board 255 (e.g., a finger PCB, a sub-substrate or FPCB) disposed near the drive motor 260. According to an embodiment, the third printed circuit board 255 may be disposed at a position to be electrically connected to a first connection portion C1 slid out from the drive motor 260 and a second connection portion C2 slid out from the battery B. For example, the drive motor 260 may be electrically connected to the second printed circuit board 252 via the flexible printed circuit board F1 in which one end is electrically connected to the second printed circuit board 252 disposed in the second space 2201 of the second housing 220 and the other end is electrically connected to the third printed circuit board 255. According to an embodiment, the flexible printed circuit board F1 may be made of an elastic material or in shape that is expanded in the slide-out state and is restored to an original position in the slide-in state. According to an embodiment, the flexible printed circuit board F1 may include a flexible printed circuit board (FPCB) or a flexible RF cable (FRC).

Figure 5B:
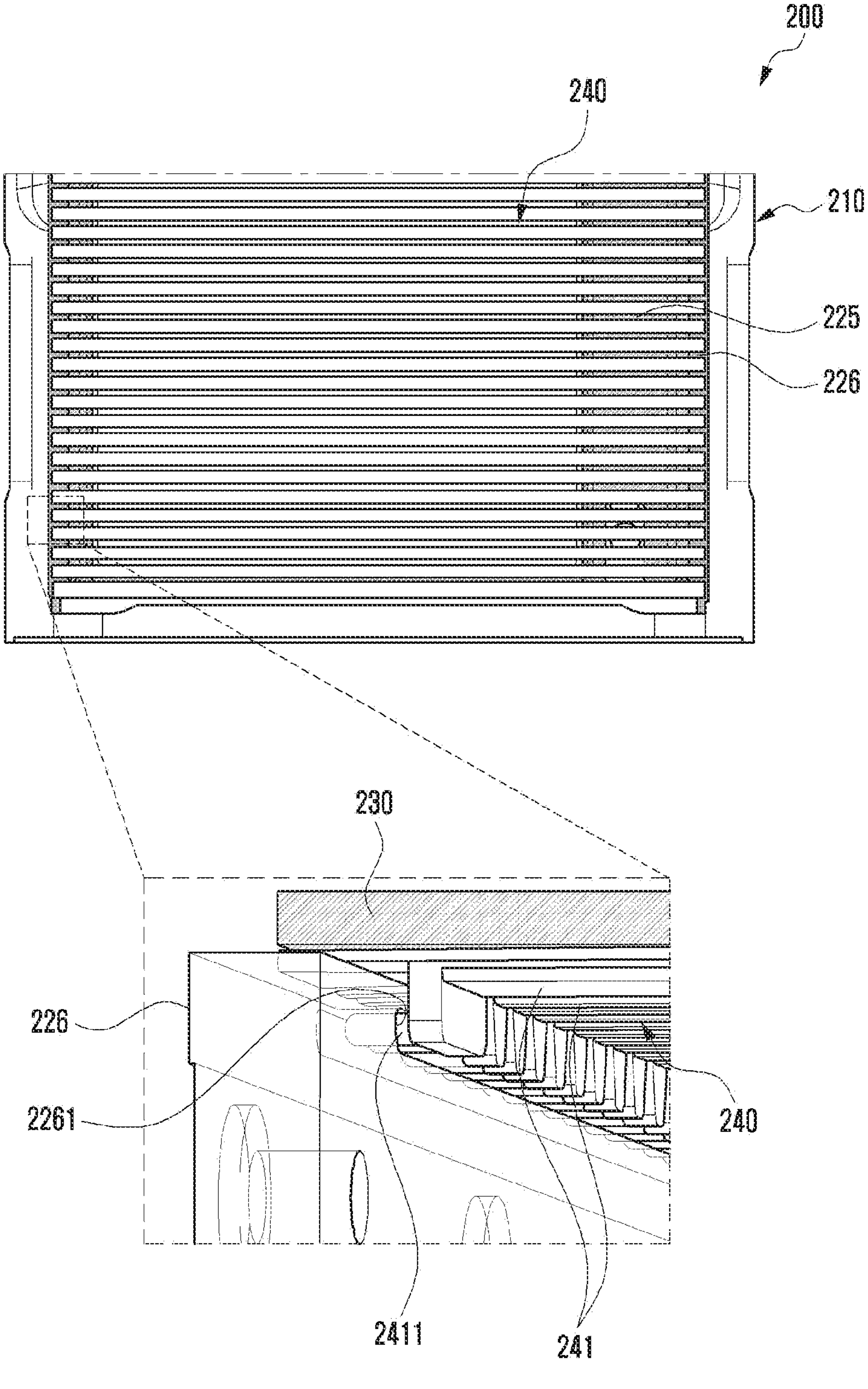
FIG. 5B is a view illustrating a portion of the configuration of an electronic device including a guide structure according to an embodiment of the disclosure.

FIG. 5B is a view illustrating a portion of the configuration of an electronic device including a guide structure according to an embodiment of the disclosure.

Referring to FIG. 5B, the electronic device 200 may include a support member 240 configured to support the rollable display 230 and a pair of guide rails 226 configured to guide opposite ends of the support member 240. According to an embodiment, the pair of guide rails 226 may be respectively fixed to opposite ends of the support bracket 225 in the first space 2101 of the first housing 210. According to an embodiment, the support member 240 may include multiple bars 241 rotatably coupled to each other and a guide protrusion 2411 protruding from each of opposite ends of each of the multiple bars 241. According to an embodiment, the guide rails 226 may be fixed to opposite side surfaces of the support bracket 225 disposed in the first space 2101 of the first housing 210. According to an embodiment, the guide rails 226 may each include a guide slit 2261 provided at a position corresponding to a movement trajectory of the support member 240. According to an embodiment, when the support member 240 fixed in such a manner of being attached to the rear surface of the rollable display 230 is movably coupled to the guide rails 226, the guide structure in which the guide protrusions 2411 move along the guide slits 2611 may help reduce a phenomenon in which the rollable display 230 is separated or deformed during operation.

Figure 6A:
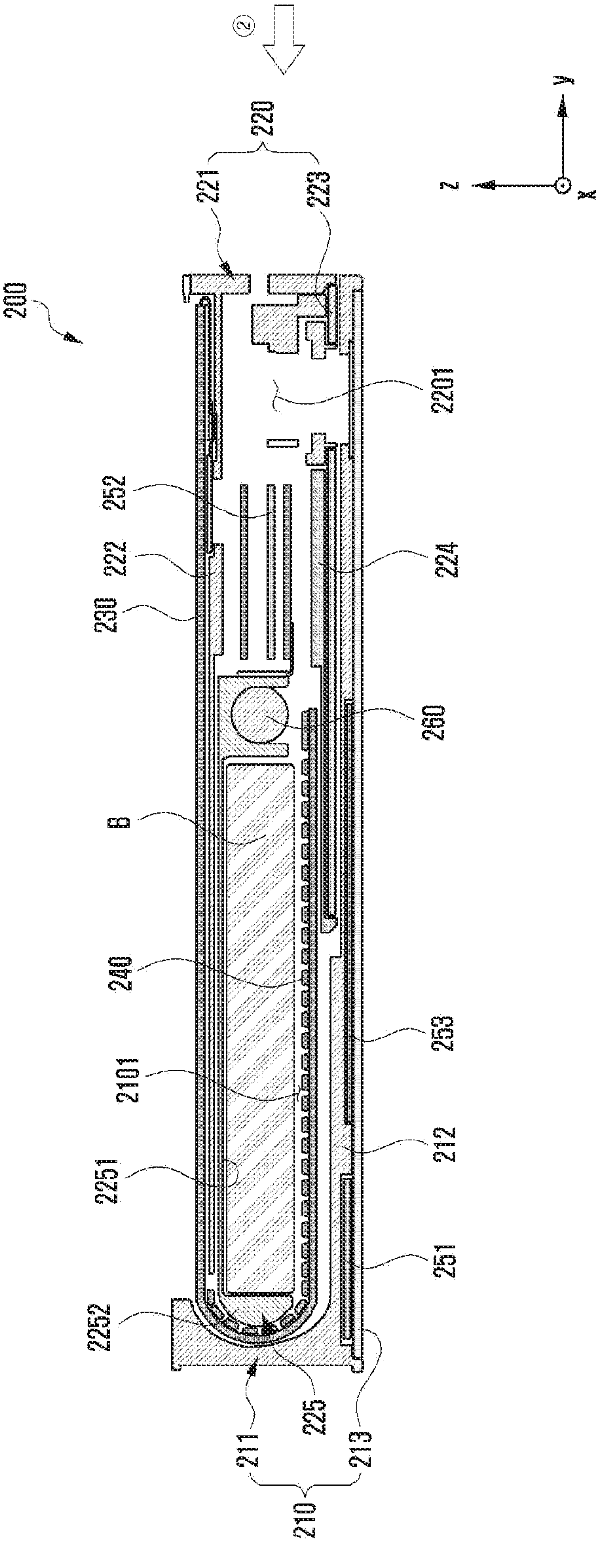
FIG. 6A is a cross-sectional view of the electronic device taken along line 6*a*-6*a* in FIG. 2A according to an embodiment of the disclosure.

FIG. 6A is a cross-sectional view of the electronic device taken along line 6*a*-6*a* in FIG. 2A according to an embodiment of the disclosure.

Figure 6B:
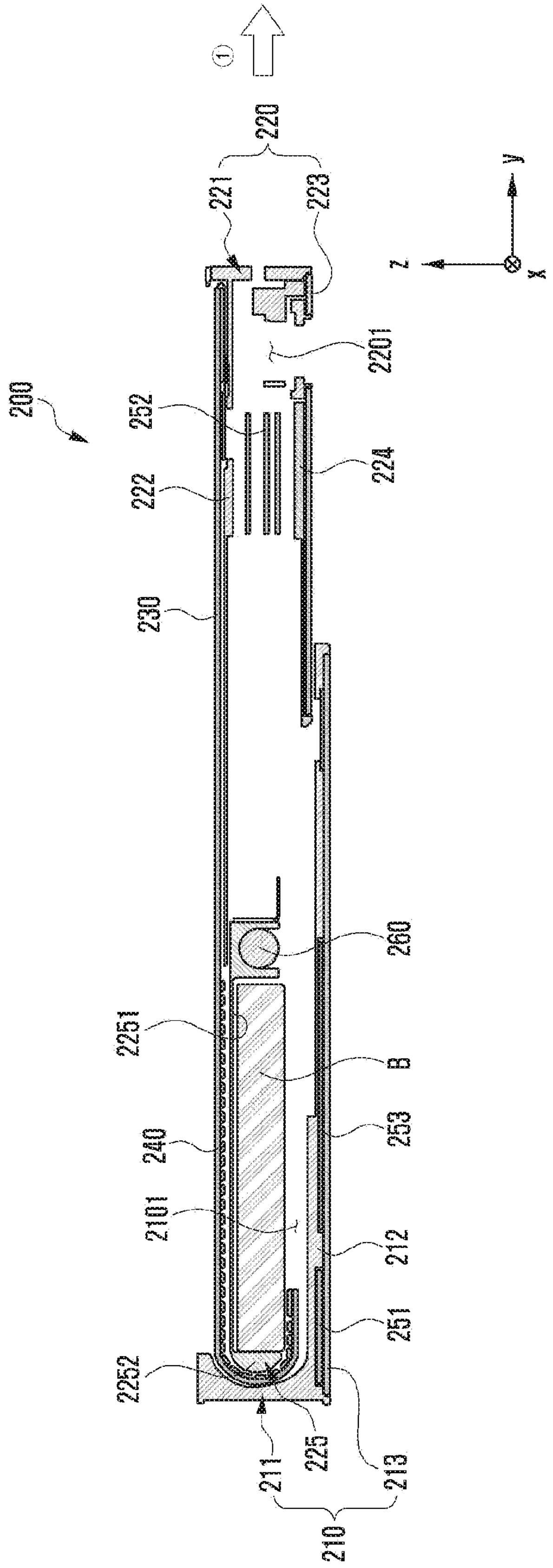
FIG. 6B is a cross-sectional view of the electronic device of the disclosure taken along line 6*b*-6*b* in FIG. 3A according to an embodiment of the disclosure.

FIG. 6B is a cross-sectional view of the electronic device taken along line 6*b*-6*b* in FIG. 3A according to an embodiment of the disclosure.

In describing the electronic device of FIGS. 6A and 6B, components that are substantially the same as those of the electronic device of FIG. 4 are assigned with the same reference numerals, and a detailed description thereof may be omitted.

Referring to FIGS. 6A and 6B, the electronic device 200 may include a first housing 210 including a first space 2101, a second housing 220 including a second space 2201, a support member 240 connected to the first housing 210 and at least partially accommodated in the first space 2101 in a bending manner in the slide-in state, a rollable display 230 disposed to be supported by at least a portion of the support member 240 and at least a portion of the second housing 220, and a drive motor 260 including a pinion gear (e.g., the pinion gear 261 in FIG. 5A) disposed in the first space 2101 and engaged with a rack gear (e.g., the rack gear 2221 in FIG. 4) in the second space 2201. According to an embodiment, the drive motor 260 may automatically move the second housing 220 in the slide-in direction (direction ②) or slide-out direction (direction ①) with respect to the first housing 210.

According to various embodiments, in the slide-in state of the electronic device 200 (the state in FIG. 6A), at least a portion of the second housing 220 may be accommodated in the first space 2101 in the first housing 210. According to an embodiment, the first extension member 212 may be slidably coupled and guided by the support bracket 225 disposed in the second space 2201. In this case, at least a portion of the rollable display 230 may be disposed to be invisible from the outside by being accommodated into the second space 2201 together with the support member 240. In this case, the first display area of the rollable display 230 may be exposed to the outside.

According to various embodiments, at least a portion of the first housing 210 may be switched to the slide-out state of being at least partially moved to the outside from the second housing 220 along a first direction (direction θ) through the driving of the drive motor 260. According to an embodiment, in the slide-out state (the state of FIG. 6B) of the electronic device 200, the rollable display 230 may move together with the support member 240 while being supported by the support bracket 225, so that the portion slid into the first space 2101 may be at least partially exposed to the outside. In this case, a second display area of the rollable display 230 that is larger than the first display area may be exposed to the outside.

According to various embodiments, the drive motor 260 and the third printed circuit board 255 may be located closest to the second printed circuit board 252 disposed in the second space 2201 of the second housing 220 by being disposed at an edge of the support bracket 225 disposed in the first space 2101 of the first housing 210 in the slide-out direction (direction ①) (e.g., the y-axis direction). According to an embodiment, through the close arrangement structure of the drive motor 260 and the second printed circuit board 252, the length and volume of the flexible printed circuit board electrically connecting the drive motor 260 and the second printed circuit board 252 (e.g., the flexible printed circuit board F1 in FIG. 5A) is made to be minimized, so that the electronic device 200 can be improved in operational reliability.

Figure 7A:
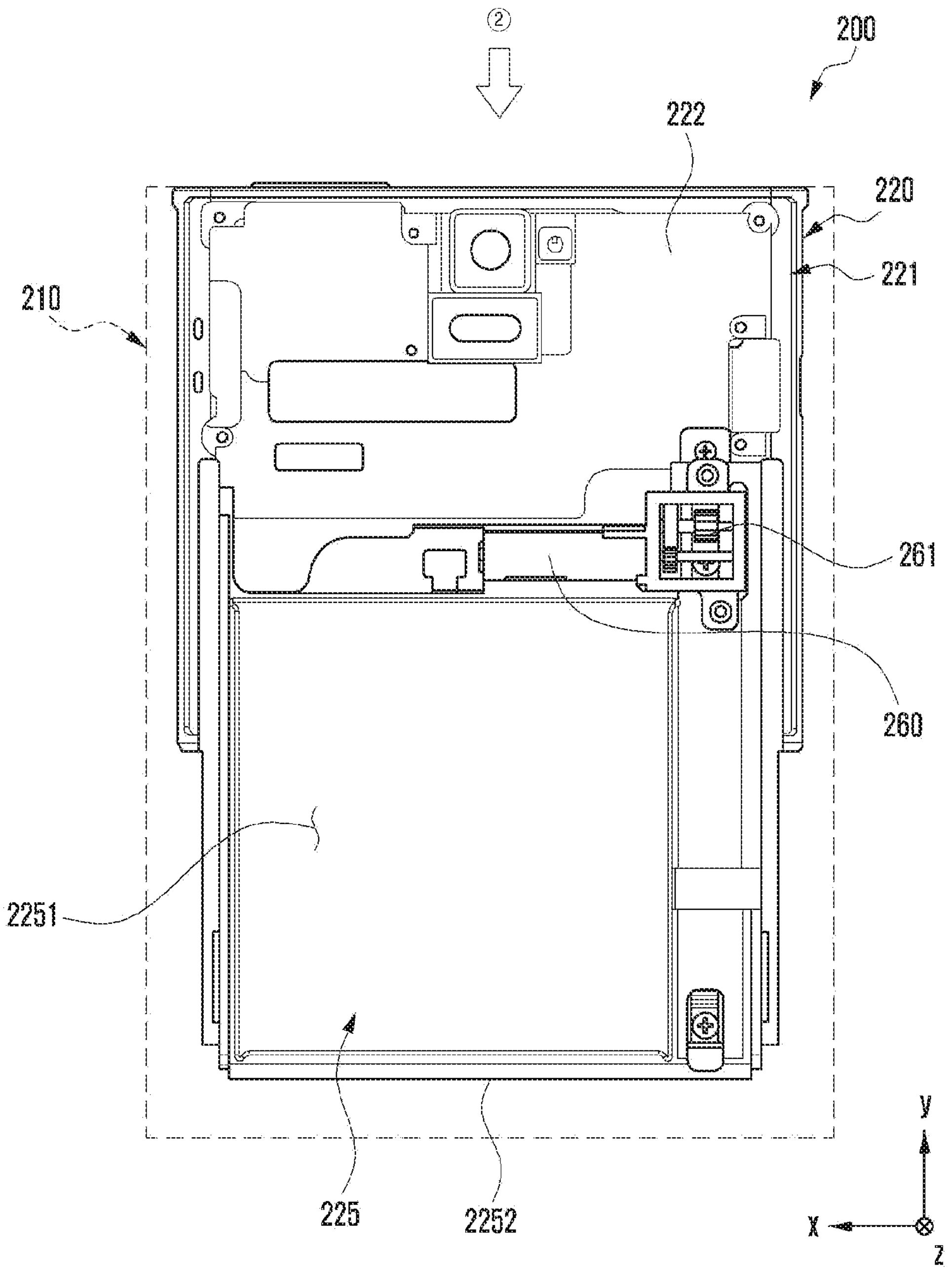
FIGS. 7A and 7B are views illustrating the relationship between a sliding distance (slide stroke) and an arrangement of the drive motor in the slide-in/slide-out state according to various embodiments of the disclosure.
Figure 7B:
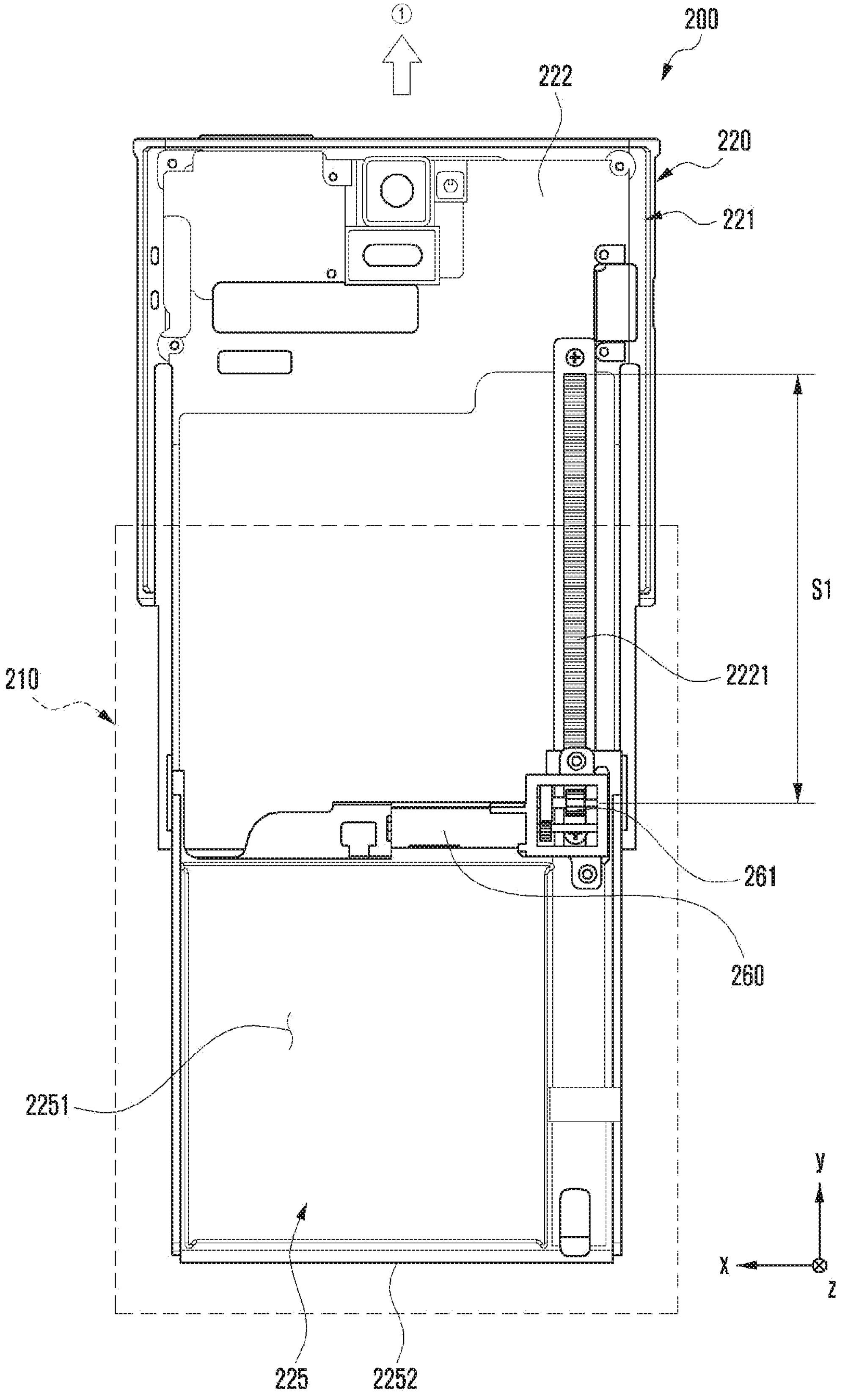

FIGS. 7A and 7B are views illustrating the relationship between a sliding distance (slide stroke) and an arrangement of the drive motor in the slide-in/slide-out state according to various embodiments of the disclosure.

Referring to FIGS. 7A and 7B, an electronic device 200 may include a first housing 210 including a first space 2101 and a second housing 220 slidably coupled to the first housing 210. According to an embodiment, the second housing 220 may be disposed to be slid out along a first direction (direction ①) (e.g., the y-axis direction) or to be slid in along a second direction (direction ②) (e.g., the −y axis direction) with respect to the first housing 210. For example, the second housing 220 may be disposed to be slidable by a predetermined reciprocating distance (slide stroke) in the up and down directions (e.g., the ±y-axis direction) with respect to the first housing 210 held by the user.

According to various embodiments, the electronic device 200 may include a drive motor 260 having a pinion gear 261 disposed on a support bracket 225 of the first housing 210. According to an embodiment, the electronic device 200 may include a rack gear 2221 arranged in the second housing 220 and engaged with the pinion gear 261. According to one embodiment, the rack gear 2221 may be arranged to be fixed to the second extension member 222 of the second housing 220. In some embodiments, the rack gear 2221 may be formed integrally with the second extension member 222. According to an embodiment, the rack gear 2221 may be arranged to have a length in a direction parallel to the sliding direction. Accordingly, the sliding distance S1 of the second housing 220 may be determined by the length of the rack gear 2221.

Figure 8A:
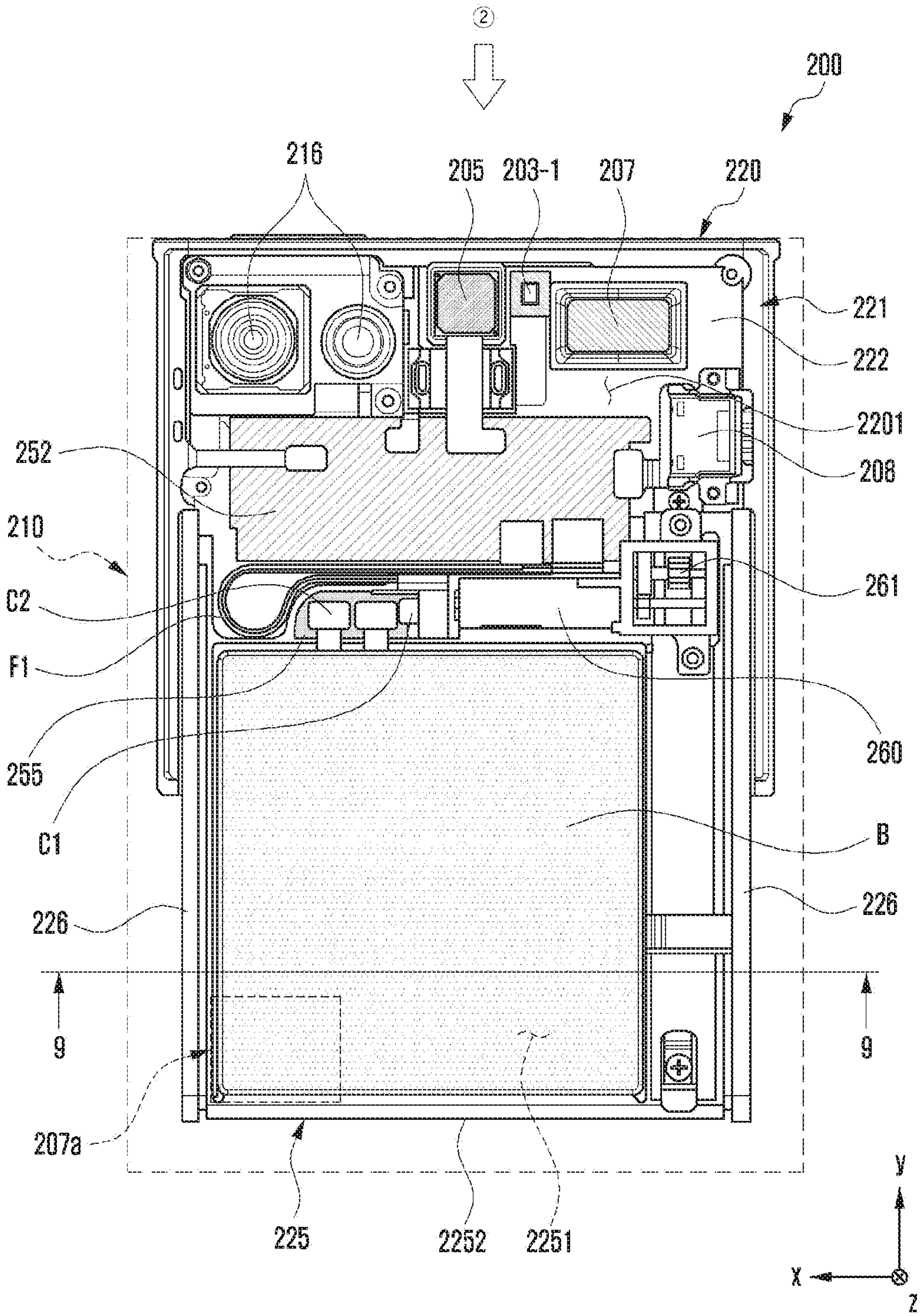
FIGS. 8A and 8B are views illustrating an electrical connection structure between a drive motor and a second printed circuit board in a slide-in/slide-out state according to various embodiments of the disclosure.
Figure 8B:
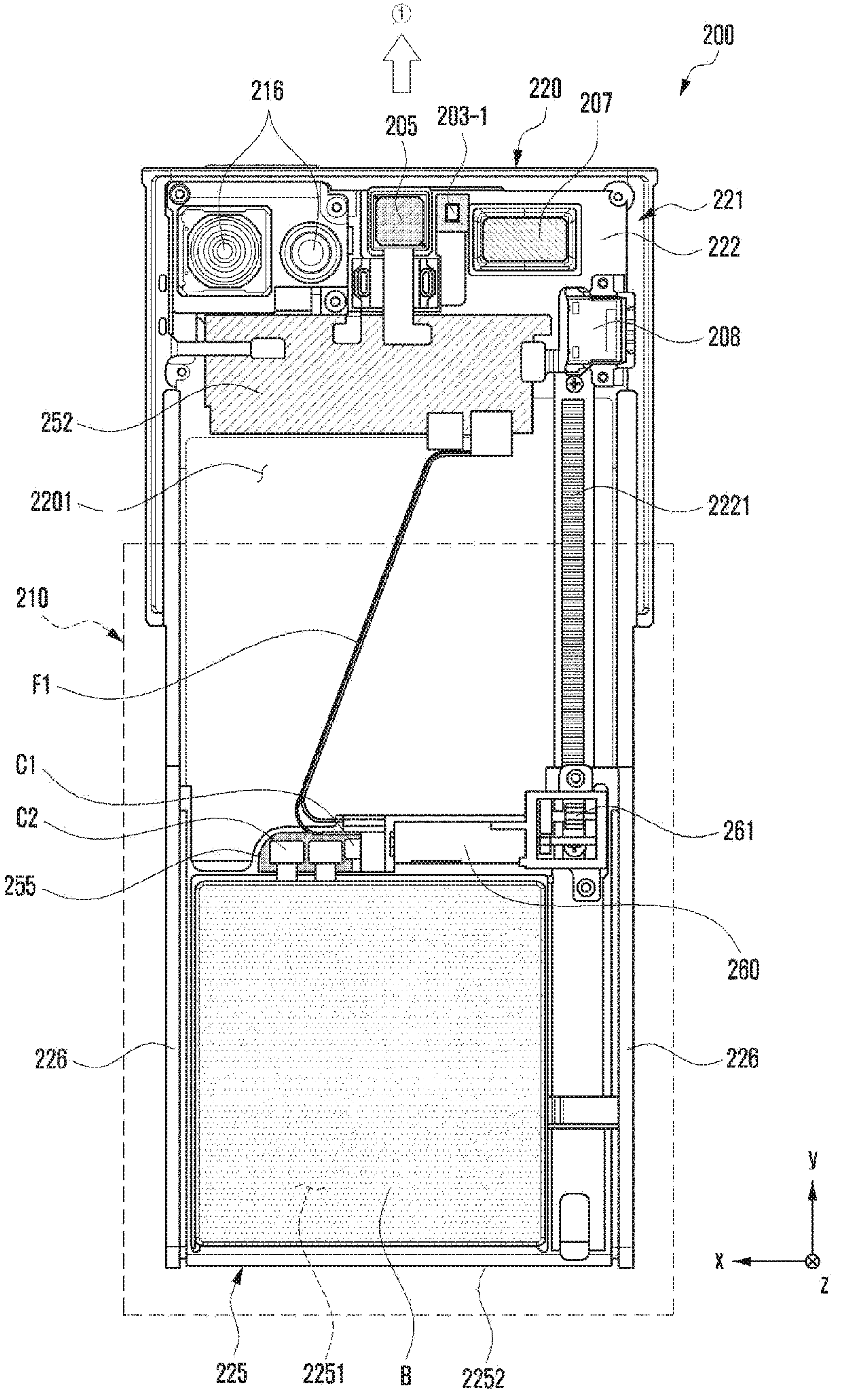

FIGS. 8A and 8B are views illustrating an electrical connection structure between a drive motor and a second printed circuit board in a slide-in/slide-out state according to various embodiments of the disclosure.

Referring to FIGS. 8A and 8B, an electronic device 200 may include a first housing 210 including a first space 2101 and a second housing 220 slidably coupled to the first housing 210. According to an embodiment, the second housing 220 may be disposed to be slid out along a first direction (direction (D) (e.g., the y-axis direction) or to be slid in along a second direction (e.g., the −y axis direction) with respect to the first housing 210.

According to various embodiments, the electronic device 200 may include multiple electronic components disposed in a second space 2201 of the second housing 220. According to an embodiment, the multiple electronic components may be arranged in the second space 2201 of the second housing 220 at positions provided by the second extension member 222. According to an embodiment, the multiple electronic components include a second printed circuit board 252, and a first camera module 205, a second camera module 216, a speaker 207, and a connector port 208 arranged around the second printed circuit board 252. According to an embodiment, since the multiple electronic component are arranged around the second printed circuit board 252 in the second space 2201 of the second housing 220, efficient electrical connection may be possible. According to an embodiment, the speaker 207 disposed in the second space 2201 may be arranged to emit sound through the second housing 220. For example, the speaker 207 may be arranged to emit sound in a predetermined direction (e.g., the y-axis direction) through a plurality of through holes provided in a fifth side surface of the second housing 220 (e.g., the fifth side surface 2212 in FIG. 3A). In some embodiments, the speaker 207 may be disposed in the first space 2101 of the first housing 210 through at least a partial area (e.g., the area 207*a* in FIG. 8A). As illustrated, the speaker may be arranged to emit sound through one side surface of the first housing 210 (e.g., the first side surface 2111 in FIG. 3A).

According to various embodiments, the electronic device 200 may include, in the first space 2101 of the first housing 210, a support bracket 225 fixed to the first housing 210, a battery B fixed to a battery seating portion 2251 of the support bracket 225, and a drive motor 260 disposed around the battery B. According to an embodiment, the drive motor 260 and the battery B may be electrically connected to a third printed circuit board 255 via connection parts C1 and C2 disposed nearby. According to an embodiment, the third printed circuit board 255 may be electrically connected to the second printed circuit board 252 via a flexible printed circuit board F1 extending from the second space 2201 to the first space 2101 and arranged to be expandable to accommodate the sliding distance. Accordingly, the drive motor 260 and the battery B may be electrically connected to the second printed circuit board 252 via the flexible printed circuit board F1. In some embodiments, the third printed circuit board 255 may be omitted, and the drive motor 260 and the battery B may be directly connected to the second printed circuit board 252 via the flexible printed circuit board F1.

According to embodiments of the disclosure, the drive motor 260 may be approached at the closest distance to the second printed circuit board 252 by being disposed at the edge of the support bracket 225 in the slide-out direction (direction (0) (e.g., y-axis direction). According to an embodiment, through the close arrangement structure of the drive motor 260 and the second printed circuit board 252, the length and volume of the flexible printed circuit board F1 electrically connecting the drive motor 260 and the second printed circuit board 252 is made to be minimized, so that the electronic device 200 can be improved in operational reliability.

Figure 9:
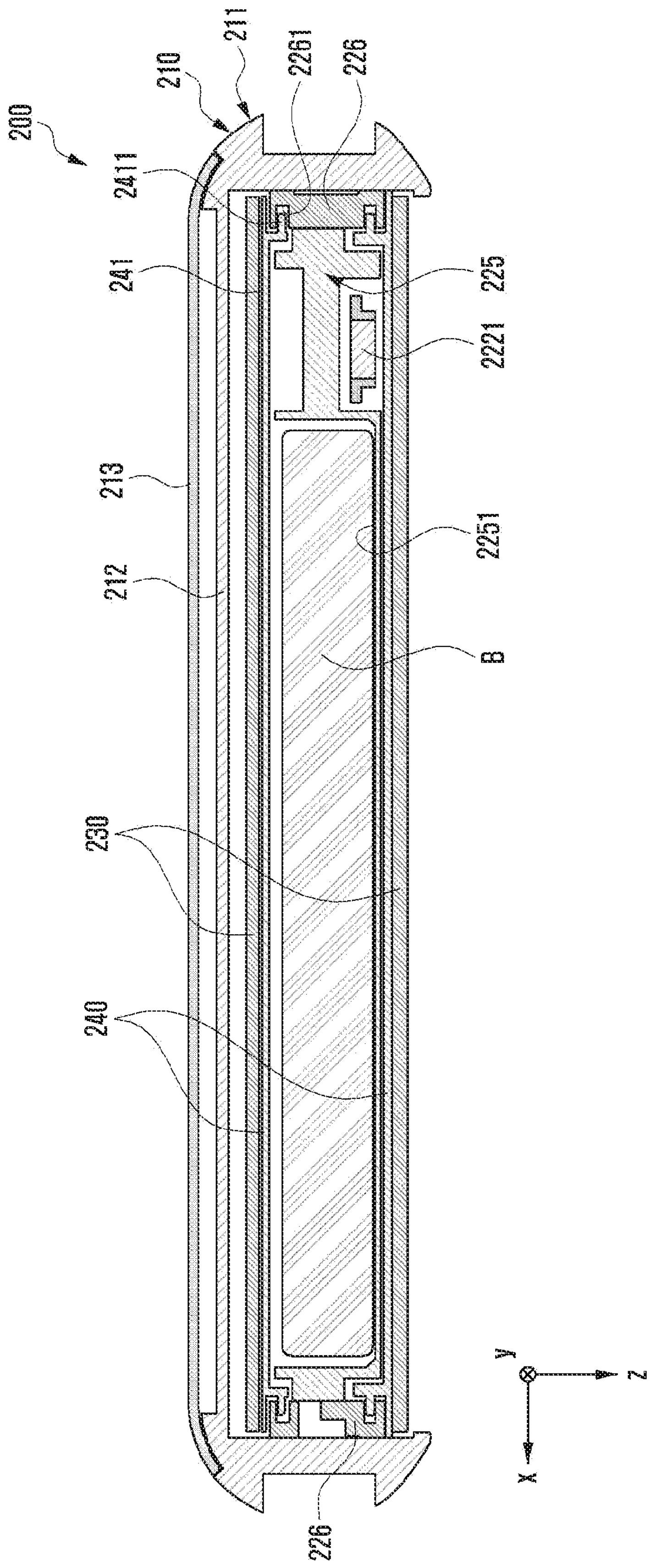
FIG. 9 is a cross-sectional view of an electronic device taken along line 9-9 in FIG. 8A according to an embodiment of the disclosure.

FIG. 9 is a cross-sectional view of an electronic device taken along line 9-9 in FIG. 8A according to an embodiment of the disclosure.

Referring to FIG. 9, an electronic device 200 may include a first housing 210, a second housing 220 slidably coupled to the first housing 210, and a rollable display 230 disposed to be supported by the first housing 210 and the second housing 220. According to an embodiment, the rollable display 230 may have one end fixed to at least a portion of the second housing 220 and the other end disposed to be supported by a support member 240 accommodated in the first space 2101 of the first housing 210 in a manner of being bent, in the slide-in state. According to an embodiment, the electronic device 200 may be configured to perform a switching operation in which the second housing 220 is switched from the slide-in state to the slide-out state or switched from the slide-out state to the slide-in state with respect to the first housing 210 held by a user.

According to various embodiments, the electronic device 200 may include a battery B disposed via a support bracket 225 fixed to the first space 2101 of the first housing 210. According to this, the battery B is not disposed in the second housing 220, which operates as a movable structure (e.g., a slide structure), but is disposed in the first housing 210, which is a fixed structure. Thus, a separate driving gap may not be required to avoid interference with peripheral structures due to movement. Accordingly, the thickness of the battery B is increased such that the battery is close to or in contact with the rear surface of the support member 240 from the battery seating portion 2251 of the support bracket 225, so that the volume of the battery may be increased. In addition, in the slide-in state, the battery B may be disposed to support the rear surface of the support member 240, so that sagging of the rollable display 230 may be reduced and operational reliability may be improved.

According to embodiments of the disclosure, the drive motor 260 is disposed at the edge of the support bracket 225 in the first space 2101, which allows the drive motor to be avoided from interfering with the rollable display 230 and/or the support member 240. As a result, it is possible to increase the size of the drive motor 260 through free design (e.g., removal of corresponding parts) of peripheral structures (e.g., the first rear surface cover 213 or the first extension member 212) facing the drive motor 260.

Figure 10:
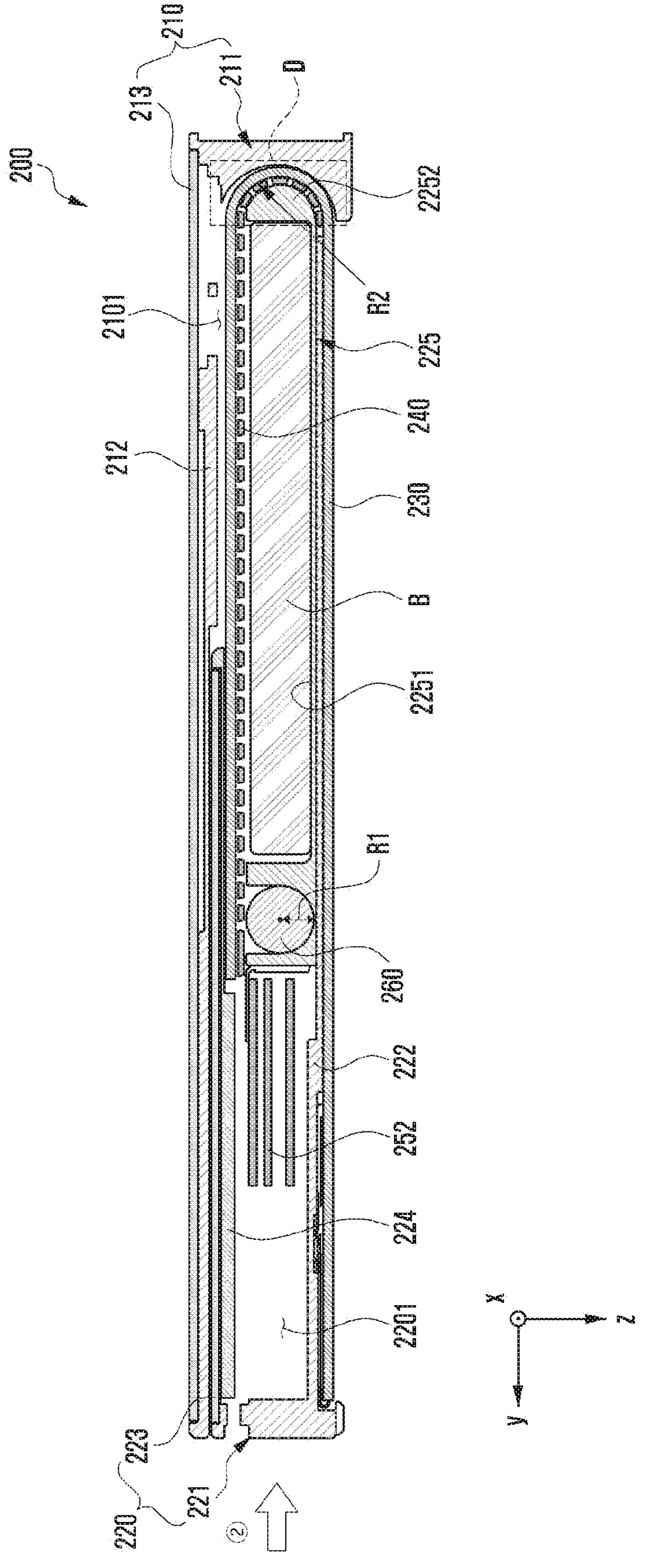
FIG. 10 is a partial cross-sectional view of an electronic device taken along line 10-10 of FIG. 2B according to an embodiment of the disclosure.

FIG. 10 is a partial cross-sectional view of an electronic device taken along line 10-10 of FIG. 2B according to an embodiment of the disclosure.

Referring to FIG. 10, an electronic device 200 may include a first housing 210 including a first space 2101 and a second housing 220 slidably coupled to the first housing 210. According to an embodiment, the second housing 220 may be disposed to be slid out along a first direction (direction ①) (e.g., the y-axis direction) or to be slid in along a second direction (e.g., the −y axis direction) with respect to the first housing 210. According to an embodiment, the electronic device 200 may include a drive motor 260 disposed on a support bracket 225 fixed to the first space 2101 of the first housing 210 and a rack gear (e.g., the rack gear 2221 in FIG. 4) disposed in the second space 2201 of the second housing 220 to be engaged with the pinion gear 261 of the drive motor 260. According to an embodiment, when the drive motor 260 operates, the rack gear 2221 may move along the first direction (e.g., the y-axis direction) or the second direction (e.g., the −y-axis direction), and the first housing 210 may also move therewith. For example, in the case where the slide-out state is switched to the slide-in state, the support member 240 supporting the rollable display 230 may be bent to have a predetermined radius of curvature R2 while being supported by the support portion 2252 provided at the edge of the support bracket 225 and then be accommodated in the first space 2101 of the first housing 210 in the manner of being bent.

According to various embodiments, the drive motor 260 fixed to the support bracket 225 may have a predetermined radius R1. In this case, by configuring the radius of curvature R2 in a bending area (area D) of the support member 240 to be larger than the radius R1 of the drive motor 260, interference applied to the rollable display 230 by the drive can be avoid during operation.

Figure 11:
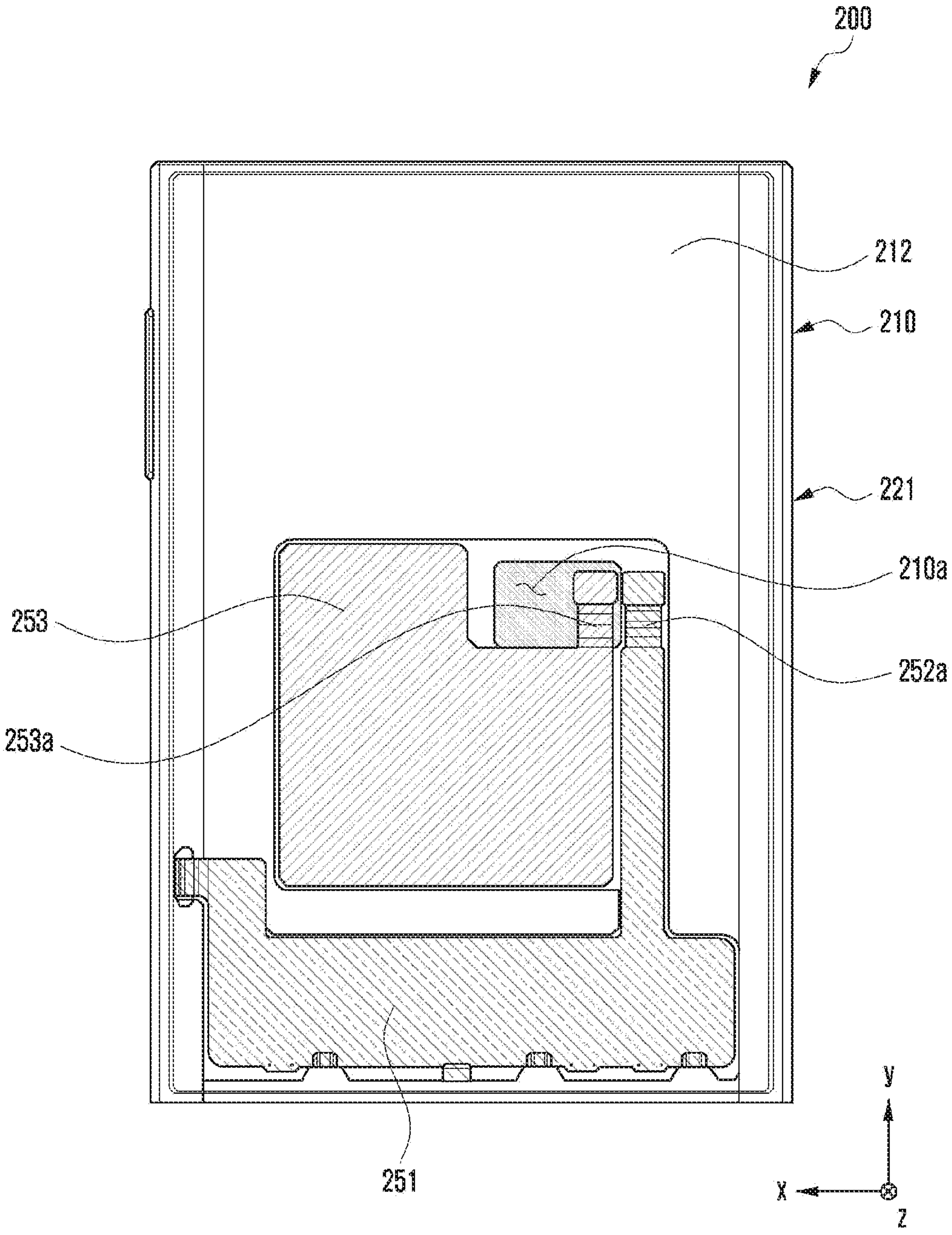
FIG. 11 is a view illustrating a configuration of an electronic device in which an arrangement structure of an antenna member and a first printed circuit board according to an embodiment of the disclosure.

FIG. 11 is a view illustrating a configuration of an electronic device in which an arrangement structure of an antenna member and a first printed circuit board according to an embodiment of the disclosure.

Referring to FIG. 11, an electronic device 200 may include a first printed circuit board 251 and an antenna member 253 disposed in a space between a first extension member 212 and a first rear surface cover 213 in the first housing 210. According to an embodiment, the antenna member 253 may include a coil member disposed through a dielectric film. According to an embodiment, the antenna member 253 may include a multi-function coil or multi-function core (MFC) antenna configured to execute a wireless charging function, a neat field communication (NFC) function, and/or an electronic payment function. According to an embodiment, the first printed circuit board 251 may be disposed such that a connector 252*a* extending from the first printed circuit board 251 is penetrated through a first through hole 210*a* provided in the first extension member 212 and then electrically connected to a flexible printed circuit board (e.g., an FPCB or FRC) disposed in the first space 2101. According to an embodiment, the antenna member 253 may also be disposed such that a connector 253*a* extending from the antenna member 253 is penetrated through the first through 210*a* and the electrically connected to the flexible printed circuit board (e.g., an FPCB or FRC) disposed in the first space 2101. In some embodiments, the first printed circuit board 251 and the antenna member 253 may be disposed to be penetrated through different through holes, respectively, disposed in the first extension member 212, and then electrically connected to the flexible printed circuit board (e.g., an FPCB or FRC) in the first space 2101.

Figure 12:
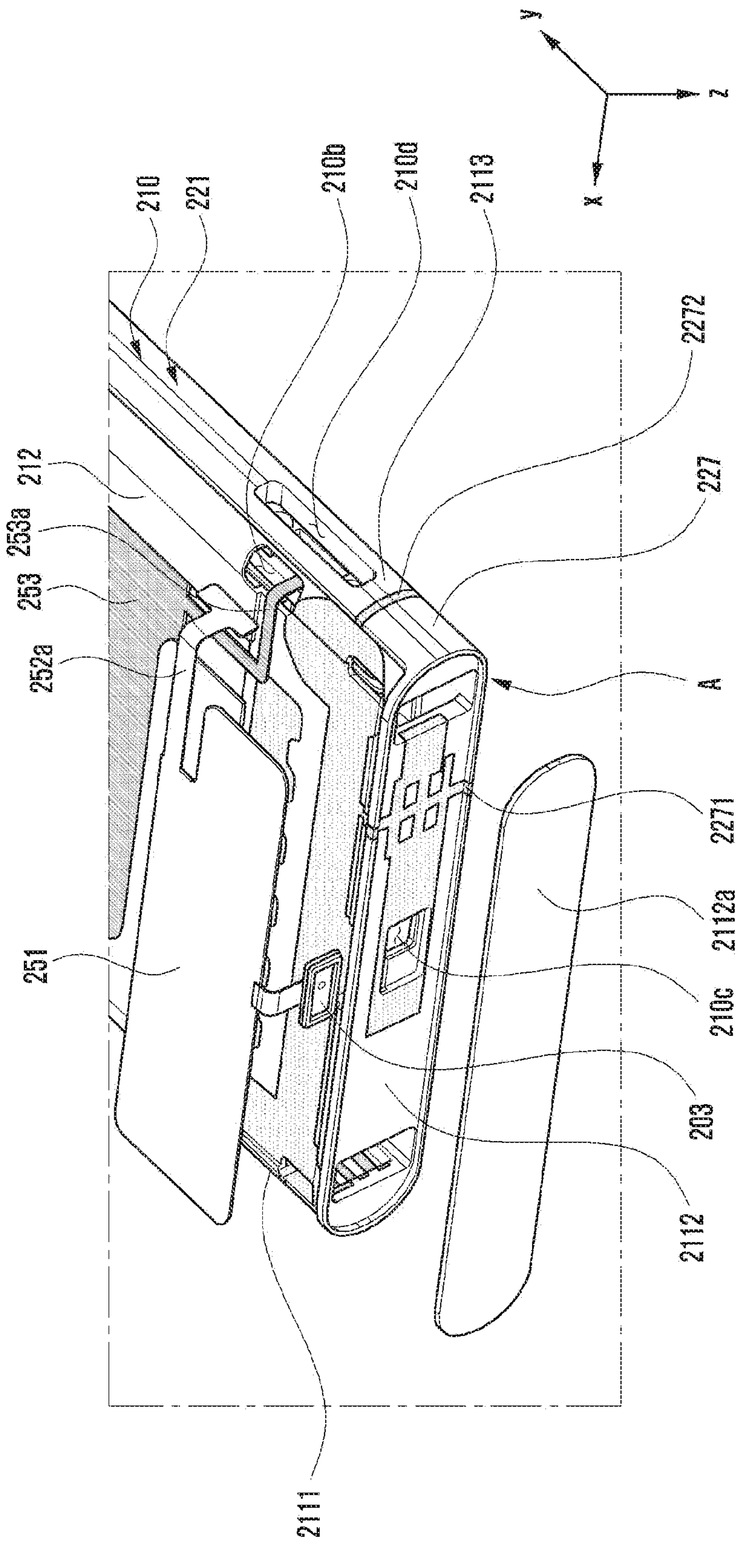
FIG. 12 is a view illustrating a configuration of an electronic device in which an arrangement structure of an antenna member and a first printed circuit board according to an embodiment of the disclosure.

FIG. 12 is a view illustrating a configuration of an electronic device in which an arrangement structure of an antenna member and a first printed circuit board according to an embodiment of the disclosure.

The first printed circuit board 251 and the antenna member 253 according to embodiments of the disclosure may have a modified electrical connection structure.

Referring to FIG. 12, an electronic device 200 may include the first printed circuit board 251 and the antenna member 253 disposed in the space between the first extension member 212 and the first rear surface cover 213 in the first housing 210. According to an embodiment, the first printed circuit board 251 and the antenna member 253 may be connected to a flexible printed circuit board (e.g., an FPCB or FRC) disposed in the first space 2101 through a first through hole 210*b* disposed at a position different from a position where the through hole 210*a* of FIG. 11 is formed, for example, at a portion of the first extension member 212 adjacent to the third side surface 2113. According to an embodiment, the electronic device 200 may include, as an input device, a microphone 203 which extends from the first printed circuit board 251 and is disposed through a second through hole 210*c* formed in the second side surface 2112 of the first housing 210. According to an embodiment, the first housing 210 may include a third through hole 210*d* disposed in the first side surface 2111 and/or the third side surface 2113. The third through hole 210*d*, which is formed to be connected to the first space 2101 from the outside, may be used as a fastening path through which guide rails (e.g., the guide rails 226 in FIG. 4) are fastened to a support bracket (e.g., the support bracket 225 in FIG. 4) using fastening members such as screws.

According to various embodiments, an electronic device (e.g., the electronic device 200 in FIG. 3A) may include a first housing (e.g., the first housing 210 in FIG. 3A), a second housing (e.g., the second housing 220 in FIG. 3A) slidably connected to the first housing, a rollable display (e.g., the rollable display 230 in FIG. 3A) disposed to be supported by the first housing and the second housing and having a display area contracted or expanded based on a slide-in or a slide-out state of the second housing, a support member (e.g., the support member 240 in FIG. 5B) disposed on the rear surface of the rollable display to support at least a portion of the rollable display, a first printed circuit board (e.g., the first printed circuit board 251 in FIG. 4) disposed in the first housing, a second printed circuit board (e.g., the second printed circuit board 252 in FIG. 4) disposed in the second housing, a flexible printed circuit board (e.g., the flexible display F1 in FIG. 4) that connects the first printed circuit board and the second printed circuit board and is folded or unfolded based on the slide-in or slide-out state of the second housing, a drive motor (e.g., the drive motor 260 in FIG. 4) disposed in the first housing, electrically connected to the first printed circuit board, and configured to provide a driving force to drive the second housing, a battery (e.g., the battery B in FIG. 4) disposed in the first housing and configured to supply power to the drive motor, a pinion gear (e.g., the pinion gear 261 in FIG. 4) disposed in the first housing and configured to transmit power based on the driving force of the drive motor, and a rack gear (e.g., the rack gear 2221 in FIG. 4) disposed in the second housing to be engaged with the pinion gear.

According to various embodiments, in the slide-in state, the drive motor may be disposed at an edge of the first housing closest to the second printed circuit board.

According to various embodiments, the electronic device may further include a third printed circuit board located around the drive motor and electrically connected to the drive motor, and the flexible printed circuit board may be electrically connected to the third printed circuit board.

According to various embodiments, the rack gear may be disposed to have a length parallel to a direction of movement of the second housing, and the second housing may have a sliding distance determined depending on the length of the rack gear.

According to various embodiments, the electronic device may further include a support bracket disposed inside the first housing, and the drive motor may be disposed at an edge of the support bracket.

According to various embodiments, the battery may be disposed to support at least a portion of the support member in the slide-in state.

According to various embodiments, the support bracket may include a bent area configured to support a rear surface of the support member, and the bent area may have a radius of curvature configured to be larger than the radius of curvature of the drive motor.

According to various embodiments, the electronic device may further include at least one electronic component electrically connected to the second printed circuit board in the second housing.

According to various embodiments, the at least one electronic component may include at least one of at least one camera module, a speaker, a microphone, a socket module, a connector module, a key button, or at least one sensor module.

According to various embodiments of the disclosure, an electronic device may include a first housing (e.g., the first housing 210 in FIG. 4) including a first space (e.g., the first space 2101 in FIG. 4) formed through a first side surface member (e.g., the first side surface member 211 in FIG. 4) and a first printed circuit board (e.g., the first printed circuit board 251 in FIG. 4) disposed in the first space (e.g., the first space 2101 in FIG. 4), a second housing (e.g., the second housing 220 in FIG. 4) slidably coupled to the first housing and including a second printed circuit board (e.g., the second printed circuit board 252 in FIG. 4) disposed in a second space (e.g., the second space 2201 in FIG. 4) formed through a second side surface member (e.g., the second side surface member 221 in FIG. 4), a rear surface cover (e.g., the first rear surface cover 213 in FIG. 4) disposed on the outer surface of the first side surface member, at least one electronic component (e.g., the antenna member 253 in FIG. 4) disposed between the first side surface member and the rear surface cover, a rollable display (e.g., the rollable display 230 in FIG. 4) disposed to be supported by the first housing and the second housing, wherein the rollable display has a display area that is expanded when at least a portion of the second housing is switched from a slide-in state in which the at least a portion of the second housing is accommodated in the first space to a slide-out state in which the at least a portion of the second housing is moved in the a direction, a third printed circuit board (e.g., the third printed circuit board 255 in FIG. 5A) disposed in the first space and electrically connected via an expandable flexible printed circuit board (e.g., the flexible printed circuit board F1 in FIG. 4) extending from the second printed circuit board to the first space, a drive motor (e.g., the drive motor 260 in FIG. 4) including a pinion gear (e.g., the pinion gear 261 in FIG. 4) electrically connected to the third printed circuit board at a position adjacent to the third printed circuit board in the first space, and a rack gear (e.g., the rack gear 2221 in FIG. 4) disposed in the second space and engaged with the pinion gear. The at least one electronic component may be electrically connected to the third printed circuit board via a through hole formed in at least a portion of the first side surface member.

According to various embodiments, the at least one electronic component may include an antenna member.

According to various embodiments, the expandable flexible printed circuit board may include a flexible printed circuit board (FPCB) or a flexible RF cable (FRC).

According to various embodiments, in the slide-in state, the drive motor may be disposed at an edge of the first side surface member closest to the second printed circuit board.

According to various embodiments, an electronic device (e.g., the electronic device 200 in FIG. 4) may include a first housing (e.g., the first housing 210 in FIG. 4) including a first side surface member (e.g., the first side surface member 211 in FIG. 4) and a first extension member (e.g., the first extension member 212 in FIG. 4) extending from the first side surface member into a first space (e.g., the first space 2101 in FIG. 4), a second housing (e.g., the second housing 220 in FIG. 4) slidably coupled to the first housing and including a second side surface member (e.g., the second side surface member 221 in FIG. 4) and a second extension member (e.g., the second extension member 222 in FIG. 4) extending from the second side surface member to a second space, a rollable display (e.g., the rollable display 230 in FIG. 4) disposed to be supported by the first housing and the second housing, wherein the rollable display has a display area that is expanded when at least a portion of the second housing is switched from a slide-in state in which the at least a portion of the second housing is accommodated in the first space to a slide-out state in which the at least a portion of the second housing is moved in the a direction, a support bracket (e.g., the support bracket 225 in FIG. 4) disposed on at least a portion of the first extension member in the first space, a first printed circuit board (e.g., the first printed circuit board 251 in FIG. 4) disposed in the first housing, a second printed circuit board (e.g., the second printed circuit board 252 in FIG. 4) disposed in the second housing, a third printed circuit board (e.g., the third printed circuit board 255 in FIG. 5A) disposed on the support bracket and electrically connected via an expandable flexible printed circuit board (e.g., the flexible printed circuit board F1 in FIG. 4) extending from the second printed circuit board to the first space, a drive motor (e.g., the drive motor 260 in FIG. 4) including a pinion gear (e.g., the pinion gear 261 in FIG. 4) electrically connected to the third printed circuit board at a position adjacent to the third printed circuit board on the support bracket, and a rack gear (e.g., the rack gear 2221 in FIG. 4) disposed in the second space and engaged with the pinion gear. The drive motor may be electrically connected to the second printed circuit board via the third printed circuit board and the expandable flexible printed circuit board, and in the slide-in state, the drive motor may be disposed at an edge of the support bracket closest to the second printed circuit board.

According to various embodiments, the electronic device may further a battery disposed through a seating portion provided through the support bracket, and the battery may be disposed to support at least a portion of the rear surface of the rollable display in the slide-in state.

According to various embodiments, the support bracket may include a bent area configured to support a rear surface of the rollable display, and the bent area may have a radius of curvature configured to be larger than the radius of curvature of the drive motor.

According to various embodiments, the first side surface member and the second side surface member may at least partially form an exterior of the electronic device.

According to various embodiments, at least a portion of the second side surface member may be accommodated in the first space to not be visible from outside of the electronic device in the slide-in state.

According to various embodiments, the rack gear may be disposed to have a length parallel to the direction, and the second housing may have a sliding distance determined depending on the length of the rack gear.

According to various embodiments, the electronic device may further include an antenna member disposed in such a way that the antenna member at least partially penetrates from an outer surface of the first extension member into the first space. The antenna member may be electrically connected to the first printed circuit board.

While the disclosure has been shown and described with reference to various to the embodiments thereof, it will be understood by those skilled in the art that various changes in form and details may be made therein without departing from the spirit and scope of the disclosure as defined by the appended claims and their equivalents.

What is claimed is:

1. An electronic device comprising:

a first housing comprising a support bracket;

a second housing slidably connected to the first housing;

a flexible display supported by the first housing and the second housing, the flexible display having a viewable display area contracted or expanded based on a movement of the second housing with respect to the first housing;

a support member disposed on a rear surface of the flexible display to support at least a portion of the flexible display;

a drive motor disposed in the support bracket;

a pinion gear connected to a portion of the drive motor;

a rack gear disposed in the second housing to be engaged with the pinion gear, wherein a driving force of the drive motor causes the rack gear to move the second housing with respect to the first housing;

a battery disposed in the support bracket of the first housing adjacent to the drive motor, the battery being configured to supply power to the electronic device;

a first printed circuit board positioned at a first side of the first housing, the first printed circuit board being connected to at least one antenna at the first housing;

a second printed circuit board disposed in the second housing;

a third printed circuit board disposed in the support bracket adjacent to the drive motor and the battery, the third printed circuit board electrically connecting to the drive motor and the battery;

a first flexible printed circuit board disposed in the first housing and configured to connect to the first printed circuit board; and a second flexible printed circuit board configured to deform according to the movement of the second housing with respect to the first housing so as to maintain a connection between the third printed circuit board and the second printed circuit board.

2. The electronic device of claim 1, wherein, in a slide-in state of the second housing, the drive motor is disposed at an edge of the first housing closest to the second printed circuit board.

3. The electronic device of claim 1, wherein the rack gear is disposed to have a length in a direction of the movement of the second housing, and wherein the second housing has a sliding distance determined depending on a length of the rack gear.

4. The electronic device of claim 1, wherein the battery, the drive motor, and the third printed circuit board are mounted to the support bracket, and wherein the drive motor is disposed at an edge of the support bracket.

5. The electronic device of claim 1, wherein the battery is disposed to support at least a portion of the support member in a slide-in state of the second housing.

6. The electronic device of claim 1, wherein the support bracket includes a bent area configured to support a rear surface of the support member, and wherein the bent area has a radius of curvature configured to be larger than a radius of curvature of the drive motor.

7. The electronic device of claim 1, further comprising:

at least one electronic component electrically connected to the second printed circuit board in the second housing.

8. The electronic device of claim 7, wherein the at least one electronic component includes at least one of at least one camera module, a speaker, a microphone, a socket module, a connector module, a key button, or at least one sensor module.

9. An electronic device comprising:

a first housing including a first space formed through a first side surface member and a first printed circuit board disposed in the first space;

a second housing slidably coupled to the first housing and including a second printed circuit board disposed in a second space formed through a second side surface member;

a rear surface cover disposed on an outer surface of the first side surface member;

at least one electronic component disposed between the first side surface member and the rear surface cover;

a flexible display disposed to be supported by the first housing and the second housing, wherein the flexible display has a display area that is expanded when at least a portion of the second housing is switched from a slide-in state in which the at least a portion of the second housing is accommodated in the first space to a slide-out state in which the at least a portion of the second housing is moved in a direction;

a third printed circuit board disposed in the first space and electrically connected to the second printed circuit board via an expandable flexible printed circuit board extending from the second printed circuit board to the first space;

a drive motor including a pinion gear electrically connected to the third printed circuit board at a position adjacent to the third printed circuit board in the first space;

a rack gear disposed in the second space and engaged with the pinion gear;

a support member disposed on a rear surface of the flexible display to support at least a portion of the flexible display; and a battery disposed in the first housing and configured to supply power to the drive motor, wherein the at least one electronic component is electrically connected to the third printed circuit board, and wherein, in the slide-in state, the battery is configured to support a rear surface of the support member to reduce sagging of the flexible display.

10. The electronic device of claim 9, wherein the at least one electronic component includes an antenna member.

11. The electronic device of claim 9, wherein the expandable flexible printed circuit board includes a flexible printed circuit board or a flexible radio frequency (RF) cable (FRC).

12. The electronic device of claim 9, wherein, in the slide-in state, the drive motor is disposed at an edge of a first side surface member closest to the second printed circuit board.

13. An electronic device comprising:

a first housing including a first side surface member and a first extension member extending from the first side surface member into a first space;

a second housing slidably coupled to the first housing and including a second side surface member and a second extension member extending from the second side surface member to a second space;

a flexible display disposed to be supported by the first housing and the second housing, wherein the flexible display has a display area that is expanded when at least a portion of the second housing is switched from a slide-in state in which the at least a portion of the second housing is accommodated in the first space to a slide-out state in which the at least a portion of the second housing is moved in a direction;

a support bracket disposed on at least a portion of the first extension member in the first space;

a first printed circuit board disposed in the first housing;

a second printed circuit board disposed in the second housing;

a third printed circuit board disposed on the support bracket and electrically connected to the second printed circuit board via an expandable flexible printed circuit board extending from the second printed circuit board to the first space;

a drive motor including a pinion gear electrically connected to the third printed circuit board at a position adjacent to the third printed circuit board on the support bracket;

a rack gear disposed in the second space and engaged with the pinion gear;

a support member disposed on a rear surface of the flexible display to support at least a portion of the flexible display; and a battery disposed through a seating portion provided on the support bracket, wherein the drive motor is electrically connected to the second printed circuit board via the third printed circuit board and the expandable flexible printed circuit board, and in the slide-in state, the drive motor is disposed at an edge of the support bracket closest to the second printed circuit board, and wherein, in the slide-in state, the battery is configured to support a rear surface of the support member to reduce sagging of the flexible display.

14. The electronic device of claim 13, wherein the support bracket includes a bent area configured to support a rear surface of the flexible display, and wherein the bent area has a radius of curvature configured to be larger than the radius of curvature of the drive motor.

15. The electronic device of claim 13, wherein the first side surface member and the second side surface member at least partially form an exterior of the electronic device.

16. The electronic device of claim 13, wherein at least a portion of the second side surface member is accommodated in the first space to not be visible from outside of the electronic device in the slide-in state.

17. The electronic device of claim 13, wherein the rack gear is disposed to have a length parallel to the direction, and wherein the second housing has a sliding distance determined depending on the length of the rack gear.

18. The electronic device of claim 13, further comprising:

an antenna member disposed in such a way that the antenna member at least partially penetrates from an outer surface of the first extension member into the first space, wherein the antenna member is electrically connected to the first printed circuit board.

* * * * *